US012360357B2

(12) United States Patent
Rancuret

(10) Patent No.: US 12,360,357 B2
(45) Date of Patent: Jul. 15, 2025

(54) SEMICONDUCTOR DEVICE MOUNTED ON A SYSTEM BOARD

(71) Applicant: Texas Instruments Incorporated, Dallas, TX (US)

(72) Inventor: Paul Lawrence Rancuret, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 858 days.

(21) Appl. No.: 17/514,138

(22) Filed: Oct. 29, 2021

(65) Prior Publication Data

US 2022/0373783 A1 Nov. 24, 2022

Related U.S. Application Data

(60) Provisional application No. 63/108,790, filed on Nov. 2, 2020.

(51) Int. Cl.
G02B 26/08 (2006.01)
B81B 7/00 (2006.01)
H05K 1/18 (2006.01)

(52) U.S. Cl.
CPC ........ *G02B 26/0833* (2013.01); *B81B 7/0032* (2013.01); *H05K 1/18* (2013.01); *B81B 2201/042* (2013.01); *B81B 2207/098* (2013.01); *H05K 2201/10121* (2013.01); *H05K 2201/10424* (2013.01)

(58) Field of Classification Search
CPC ............ G02B 26/0833; G02B 27/0101; B81B 7/0032; B81B 2201/042; B81B 2207/098; H05K 1/18; H05K 2201/10121; H05K 2201/10424; H05K 2201/10977; H05K 1/181; H05K 3/284; H05K 2203/049
See application file for complete search history.

(56) References Cited

U.S. PATENT DOCUMENTS

2015/0140736 A1* 5/2015 Pendse .................... H01L 24/48
438/109
2021/0202405 A1* 7/2021 SubramanyamNasum ................ H01L 23/49562

OTHER PUBLICATIONS

Application Report, "DLP Series-310 DMD and System Mounting Concepts", Texas Instruments Incorporated, Oct. 2013, retrieved from url: https://www.ti.com/lit/an/dlpa041/dlpa041.pdf?ts=1635517962373&ref_url=https%253A%252F%252Fwww.google.com%252F on Oct. 29, 2021.

* cited by examiner

*Primary Examiner* — Euncha P Cherry
(74) *Attorney, Agent, or Firm* — Michelle F. Murray; Frank D. Cimino

(57) ABSTRACT

An example includes: a system board having a surface; bond fingers on a surface of the system board; a semiconductor device on the surface of the system board, the semiconductor device comprising a semiconductor die having a surface, the semiconductor die comprising bond pads on the surface; conductors coupling the bond pads to the bond fingers; and a datum structure on the surface of the system board, the datum structure having openings that form wells with sides around the bond fingers.

21 Claims, 16 Drawing Sheets

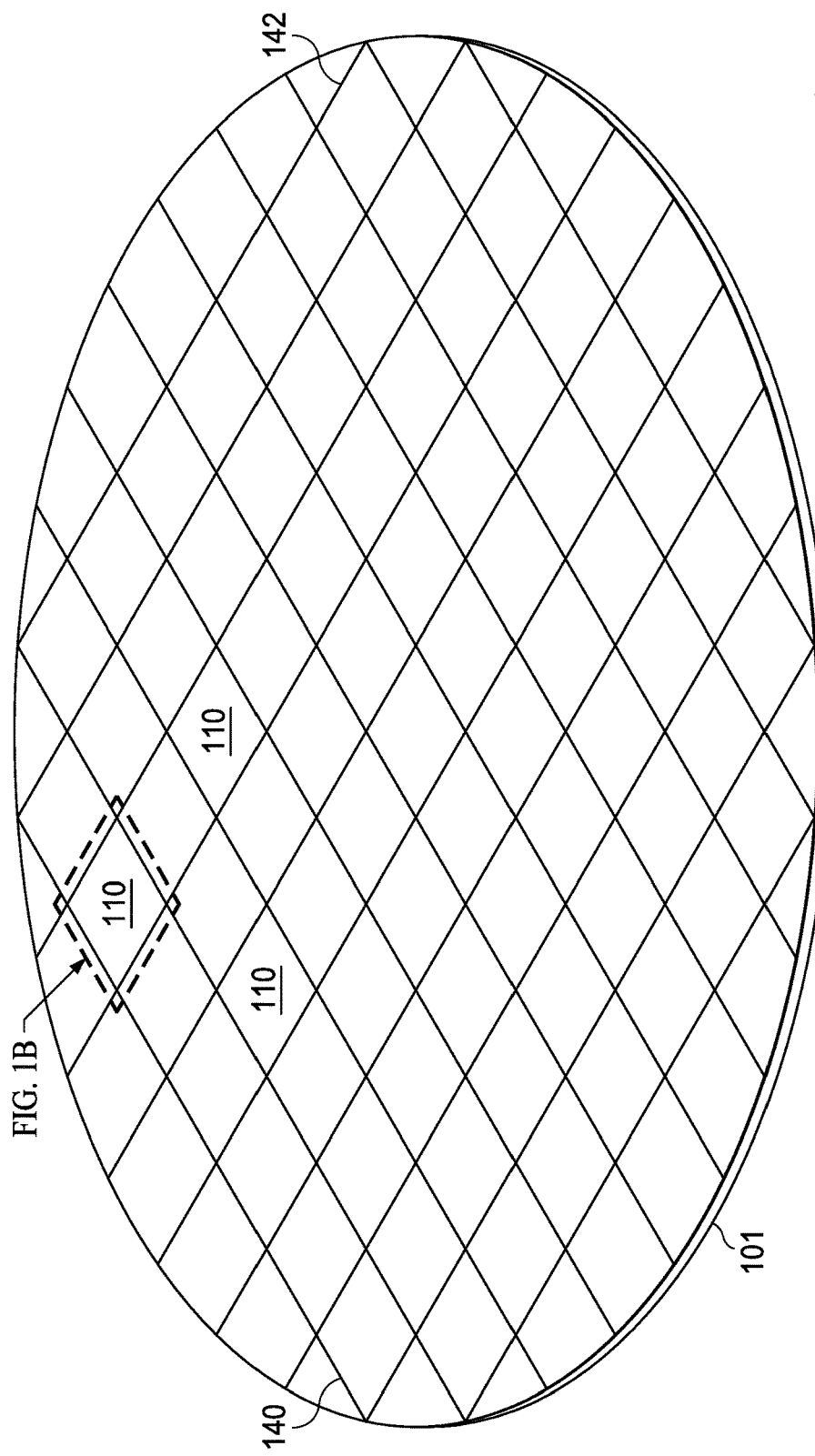
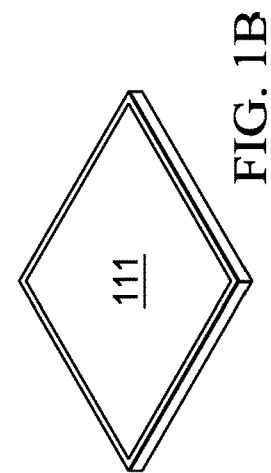
FIG. 1A
FIG. 1B

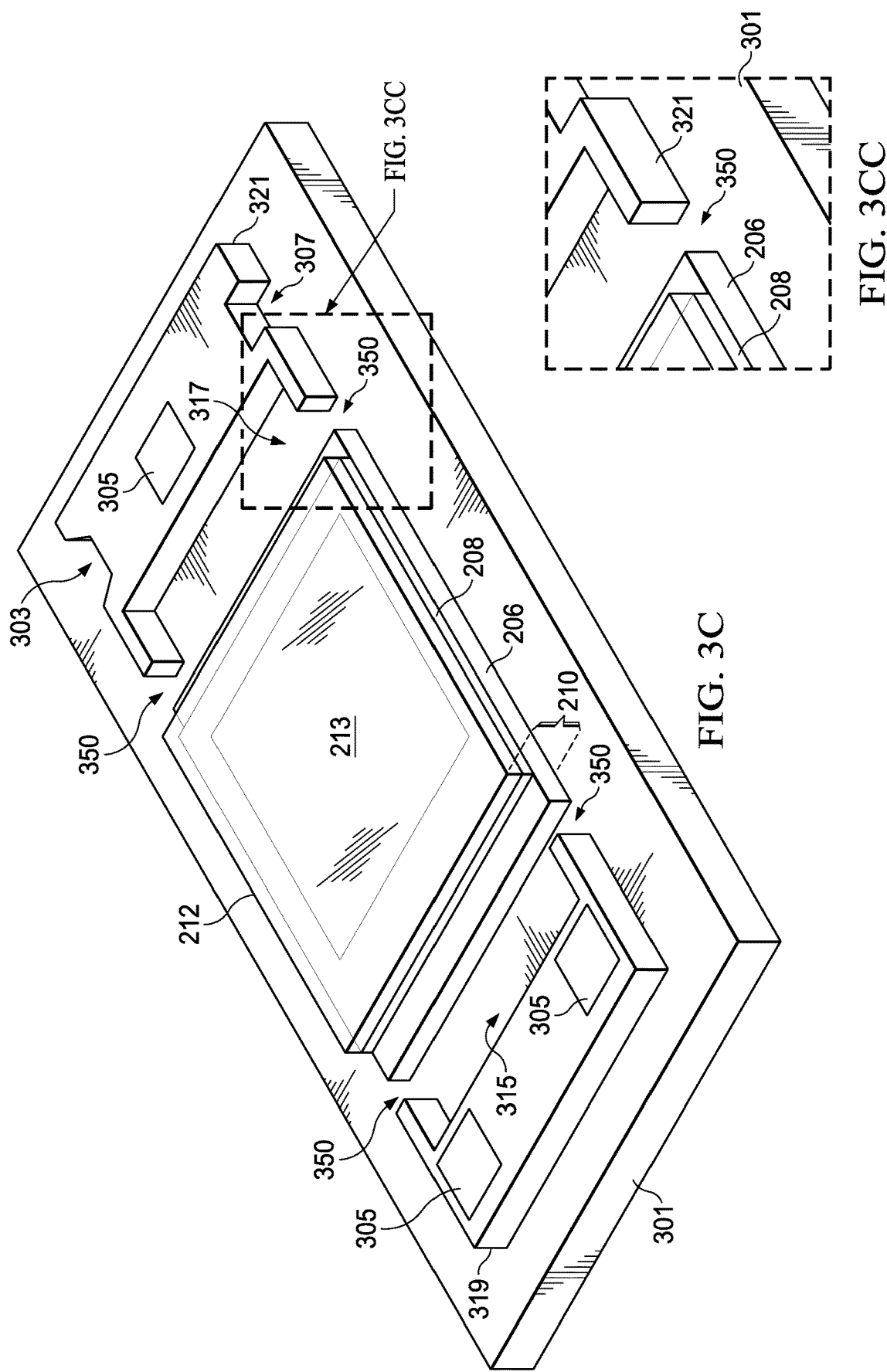

SEMICONDUCTOR DEVICE MOUNTED ON A SYSTEM BOARD

CROSS-REFERENCE TO RELATED APPLICATIONS

This application claims the benefit of and priority to U.S. Provisional Application No. 63/108,790, filed Nov. 2, 2020, which application is hereby incorporated herein by reference in its entirety.

TECHNICAL FIELD

This relates generally to electronic devices, and more particularly to a semiconductor device directly mounted to a system board.

BACKGROUND

Increasingly, optical semiconductor devices are used in portable and wearable devices. In applications where an optical semiconductor device is used in a wearable device, such as a head mounted display (HMD) which may include a near eye display, the size of the system including the optical semiconductor device increasingly needs to be reduced. Reducing package sizes, reducing costs, and removing redundancy in systems is needed.

SUMMARY

An example includes: a system board having a surface; bond fingers on a surface of the system board; a semiconductor device on the surface of the system board, the semiconductor device comprising a semiconductor die having a surface, the semiconductor die comprising bond pads on the surface; conductors coupling the bond pads to the bond fingers; and a datum structure on the surface of the system board, the datum structure having openings that form wells with sides around the bond fingers.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 1A illustrates, in a projection view a semiconductor wafer with semiconductor devices formed on a surface, while FIG. 1B illustrates a single semiconductor device after a singulation process removes it from the semiconductor wafer of FIG. 1A.

FIGS. 3A-3C illustrate, in projection views, a semiconductor die mounted to a system board in example arrangements, FIG. 3CC is a close up view of a portion of FIG. 3C.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 2A:
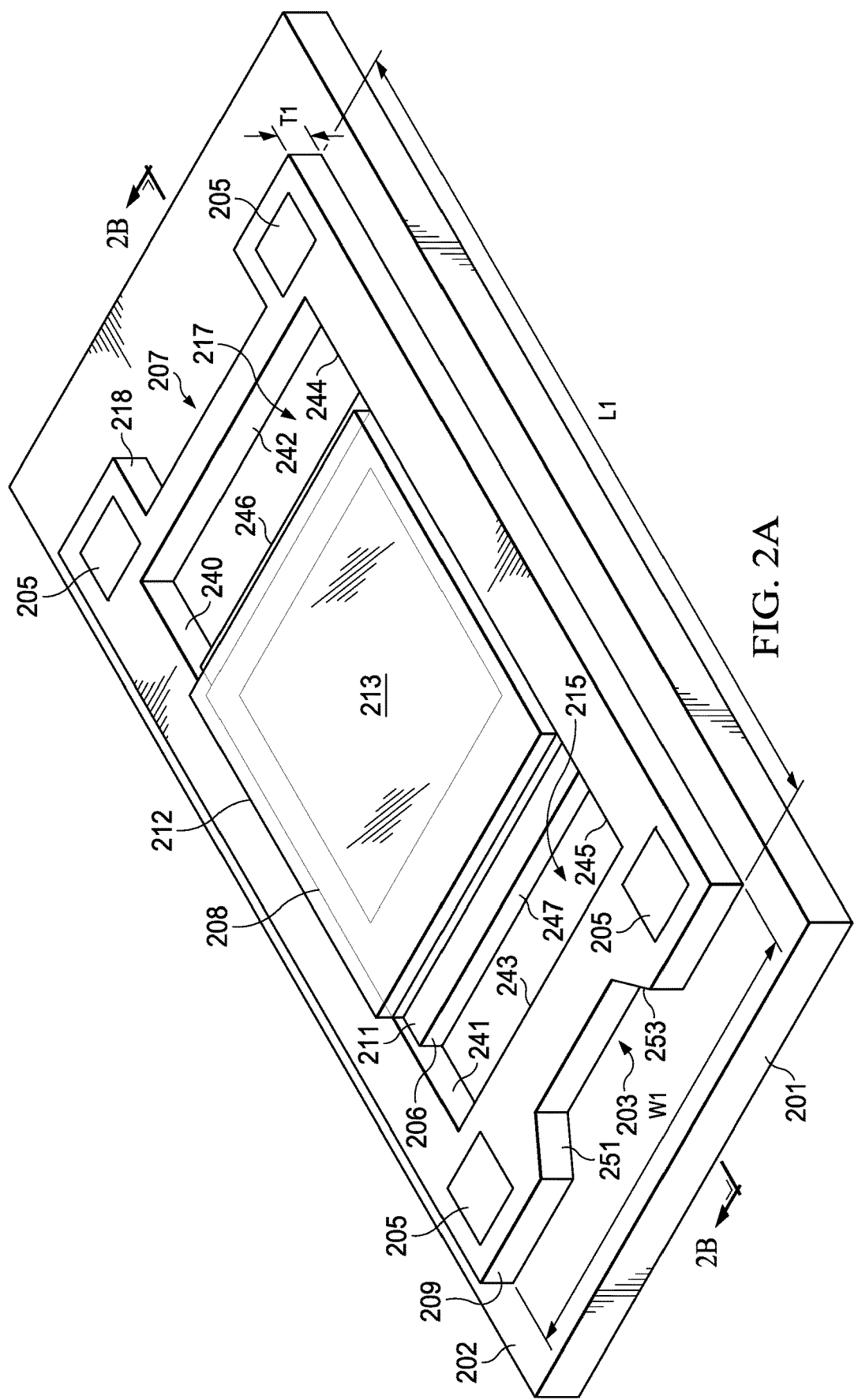
FIG. 2A illustrates, in a projection view, a semiconductor die mounted to a system board, forming an arrangement.

The making and using of example arrangements that incorporate aspects of the present application are discussed in detail below. It should be appreciated, however, that the examples disclosed provide many applicable inventive concepts that can be embodied in a wide variety of specific contexts. The specific examples and arrangements discussed are illustrative of specific ways to make and use the various arrangements, and the examples described do not limit either the scope of the specification, or the scope of the appended claims.

For example, when the term "coupled" is used herein to describe the relationships between elements, the term as used in the specification and the appended claims is to be interpreted broadly, and is not limited to connected or directly connected but instead the term "coupled" may include connections made with intervening elements, and additional elements and various connections may be used between any elements that are coupled. The term "optically coupled" is used herein. Elements that are "optically coupled" have an optical connection between the elements but various intervening elements can be between elements that are optically coupled.

The term "package substrate" is used herein. A package substrate is a support having a surface suitable for mounting a semiconductor device. In the arrangements, useful package substrates can include: ceramic substrates, including multiple layer ceramic substrates with conductors in layers coupled by vertical conductive vias, glass reinforced laminate substrates such as flame-retardant 4 (FR4) substrates which can include multiple layers and conductors in multiple layers coupled by vertical vias, laminate substrates with multiple layers of conductors and insulator layers; printed circuit board substrates of ceramic, plastic, fiberglass or resin; lead frames of copper, copper alloys, stainless steel or other conductive metals (such as Alloy 42); molded interconnect substrates (MIS); pre-molded lead frames (PMLFs) with lead frame conductors and dielectric material in a preformed structure; and tape based and film-based substrates carrying conductors. Lead frames that are half-etched or partially etched to form portions of different thicknesses, or to form openings in metal layers, can be used.

The term "system board" is used herein. A system board is a substrate that has multiple components for implementing a system mounted to it. The system board can include multiple conductor levels spaced apart by insulating layers to provide conductive traces. Use of multiple levels of conductors separated by dielectric layers increases trace routing freedom by adding the possibility of conductive traces crossing without making contact by crossing at different levels, remaining isolated from each other by the dielectric layers. The conductive traces can couple components mounted to the board together to provide power, ground and communications signals connected to the components and to make connections between the components. Conductive bond fingers can be provided in an area near a die mounting surface of the system board. The bond fingers allow connections to enable semiconductor components mounted to the system board to be electrically coupled to traces in the system board. Conductive lands can be provided on the device mounting surface of the system board to enable components to be surface mounted. In surface mounting technology (SMT), packaged semiconductor devices are mounted using solder to form solder joints between a solder ball or ball grid array terminal on a component and a conductive land or pad on the system board. Components can also be mounted using filled conductive holes, for example dual in line packages (DIP) for semiconductor devices can be mounted with extended narrow shaped leads inserted into conductive holes and then soldered to the system board. The system board provides mechanical support and electrical connection for the components, and can provide electrical connections between the components. In example arrangements, at least one semiconductor die is directly mounted to the system board using conductors formed between bond pads on the semiconductor die and bond fingers on the system board.

The term "semiconductor die" is used herein. As used herein, a semiconductor die can be a discrete semiconductor device formed on a semiconductor substrate, such as a bipolar transistor, a few discrete devices such as a pair of power field effect transistor (FET) switches fabricated together on a single semiconductor die, or a semiconductor die can be an integrated circuit with multiple semiconductor devices such as the multiple capacitors in an analog-to-digital (A/D) converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor die could be a multichip module, or the semiconductor die could be a stacked semiconductor die arrangement. The semiconductor die can be a micro electro-mechanical system (MEMS) device, such as a digital micromirror device (DMD). The semiconductor die can be an optical receiver or transmitter, an optical sensor, an optical imager, or a mirror, and can be a spatial light modulator (SLM) such as a liquid crystal on semiconductor (LCOS) device or a DMD device. The SLM can be an amplitude SLM device or a phase SLM device. The semiconductor die has a first device side surface and a second backside surface, with active or passive semiconductor devices formed on the first device side surface.

Optical semiconductor dies are increasingly used in systems. Example applications include automotive headlamps, head-up displays, wearable devices, head mounted displays, near eye displays, smart goggles, smart glasses, portable optical projectors, 3D light field displays, window displays, 3D printing, lidar, spectroscopy, 3D scanning, and pico-projectors built into smartphones, tablets, and laptops. In some systems, two optical semiconductor dies are used, for example in an imaging system where each of a viewer's eyes receives a separate projected image, two optical semiconductor dies can be used and can be operated contemporaneously. In these example arrangements, the two optical semiconductor dies provide two separate projected images for viewing by a viewer's left and right eye, and can provide images with perceived depth. Head mounted displays and near eye displays, such as eyeglasses with augmented reality display windows in a portion of the lenses, are useful applications for the arrangements. Goggles for virtual reality displays or augmented reality displays are useful applications for the arrangements.

The term "packaged semiconductor device" is used herein. A packaged semiconductor device has at least one semiconductor die electronically coupled to terminals and has package components that protects and covers the semiconductor die. The packaged semiconductor device can have a package body formed by a thermoset epoxy resin in a molding process, or by the use of epoxies, plastics, or resins that are liquid at room temperature and are subsequently cured. The package may provide a hermetic package for the packaged semiconductor device.

The term "datum" is used herein. A datum is a starting point for positioning a device. The term "datum structure" is used herein. A datum structure is a structure that includes datum features. The term "datum feature" is used herein. A datum feature is an element that provides a datum.

Packaged semiconductor devices are fabricated with conductors connecting bond pads of a semiconductor die to conductive bond fingers on a package substrate. A dielectric material, such as mold compound, a particular mold compound material referred to as glob top mold compound, or another dielectric material, covers the electrical connections and the bond pads of the semiconductor device, while a portion of the semiconductor device is free from the mold compound. The packaged semiconductor devices are then mounted to a system board. The system board can be referred to as a printed circuit board (PCB). The system board is another substrate which can be made with materials similar to the package substrate. The system board is configured to mount several components which can include passive devices, packaged semiconductor devices, power devices, sensors and connectors.

In an example arrangement, an apparatus includes a semiconductor die having a first device side surface and an opposite second backside surface. In the arrangements, a semiconductor die has the second backside surface mounted to a device mounting surface of a system board. The system board can include other components used in a system. The system board has conductive bond fingers on the device mounting surface for coupling to conductors. These conductors are further coupled to bond pads on the semiconductor die. The bond fingers are positioned near the die mounting portion on the device mounting surface of the system board, and the second backside surface of the semiconductor die is mounted to the die mounting portion using die attach film or another adhesive. The conductors make electrical connections between the bond fingers on the system board and bond pads on the semiconductor die. In one example the conductors are bond wires coupled in a wire bonding process. The bond wires can be gold, copper, palladium coated copper, silver, or aluminum bond wires. A dielectric material, for example a mold compound, is used to cover the bond wires and protect the bonds on the system board and the bonds on the semiconductor die. In the arrangements, one or more datum structures are mounted on the system board. The datum structures have a thickness and extend above a surface of the system board. In an example where the semiconductor die includes an array of micromirrors, the datum structures provide position and alignment datum information about the array of micromirrors formed over the device side surface of the semiconductor die. The datum structures have openings extending through the datum structures that form wells that surround the bond fingers on the system board. The wells are arranged to contain and limit the flow of mold compound when it is deposited over the conductors, the bond pads of the semiconductor die, and the bond fingers. In an example arrangement, the datum structures are used to position an optical semiconductor die on a system board with proper alignment and position orientation for use in an optical path.

Use of the arrangements provides the capability to mount a semiconductor die to a system board without the need for a semiconductor device package, reducing costs and eliminating a package substrate and the materials used to mount the package to a system board, while the arrangements provide the datum information needed for correctly positioning the semiconductor die on the system board. The arrangements provide a semiconductor die mounted to a system board using thermally conductive die attach, so that thermal path from the semiconductor die is directly into the system board, which can improve thermal dissipation. Use of the arrangements results in less volume needed for mounting the semiconductor die to the system board, reducing the volume needed for the system (when compared to mounting the semiconductor die without the use of the arrangements). The thickness of the arrangements is less than the thickness of a packaged semiconductor device mounted to a system board, reducing the Z-axis dimensions of the system.

FIGS. 1A and 1B illustrate a semiconductor wafer 101 including a plurality of semiconductor devices 110, and a single semiconductor device 111 after it has been removed from the semiconductor wafer 101 in a singulation process, respectively. In semiconductor device manufacturing, semiconductor dies are formed on wafers in a semiconductor fabrication facility, using semiconductor manufacturing process including ion implantations, doping, anneals, photolithography, dielectric deposition, metal deposition, planarization, and passivation. In wafer level package (WLP) processing, the semiconductor dies manufactured on the wafers are further processed. For example, for semiconductor dies useful with the arrangements, optical covers can be mounted over the semiconductor dies while the semiconductor dies are still part of the wafer, lowering assembly costs. The semiconductor devices 110 can then be removed from the wafer in a cutting operation, using the scribe lines 140, 142 shown in FIG. 1A, to separate the assemblies from one another.

In FIG. 1A, a semiconductor wafer 101 is shown with a plurality of semiconductor devices 110 in the semiconductor wafer 101 arranged in rows and columns and spaced from one another by scribe lines 142, shown in a first direction as the semiconductor wafer 101 is oriented in FIG. 1A, and scribe lines 140, shown in a second direction in FIG. 1A that is normal to the first direction. After semiconductor devices 110 are manufactured using semiconductor fabrication processes, a wafer level packaging step mounts an interposer and covers to the semiconductor dies while the semiconductor dies are still on the semiconductor wafer 101, the semiconductor devices 110 then including the semiconductor dies, the interposers, and the covers. The semiconductor wafer 101 is then singulated into unit semiconductor devices 111 by use of a saw or laser cutting tool to cut the semiconductor wafer 101 along the scribe lines 140 and 142. FIG. 1B illustrates a single semiconductor device 111 such as can be used in the arrangements. A single semiconductor device 111 can be directly mounted to a system board in the arrangements, as is described below. In some arrangements, multiple semiconductor devices 111 can be mounted to a system board.

FIG. 2A is a projection view illustrating an example arrangement. In FIG. 2A, a semiconductor die 206 is shown mounted on a device mounting surface 202 of a system board 201. The system board 201 extends beyond the area shown in FIG. 2A, and additional components including additional packaged semiconductor devices and passive components can be mounted to the system board 201. The system board 201 can be a printed circuit board, for example, the system board 201 can be a fiber reinforced epoxy printed circuit board such as flame retardant 4 (FR4). Alternative materials used for printed circuit boards can be used, for example bismaleimide triazine resin (BT resin), epoxies, resins, tapes and films.

The system board 201 will include conductors (not shown for clarity) that form traces for connecting components, and the conductors will be spaced apart by dielectric material of the system board. Bond pads 211 are shown on the device side surface of semiconductor die 206, conductors (not shown in FIG. 2, but shown below in FIG. 4D) will be formed to couple the bond pads 211 on the semiconductor die 206 to bond fingers (not shown) on system board 201. The semiconductor die 206 has an active array 213 formed on it. Active array 213 is array of digital micromirrors. The array of digital micromirrors has a surface plane. In an example application, the semiconductor die 206 will be positioned so the surface plane of the active array 213 of digital micromirrors is normal to an optical path. Cover 212, an optically transmissive window such as a transparent glass cover, is shown overlying an interposer 208 and covering at least a portion of the semiconductor die 206, which can be an optical semiconductor die. The semiconductor die 206, the interposer 208, the active array 213, and the cover 212 can be provided as a semiconductor device 210, similar to semiconductor device 111 shown in FIG. 1B.

A datum structure 209 is mounted on the system board 201. The datum structure 209 can be made of a polymer, a plastic, a ceramic, a film or tape, or a mold compound. The datum structure can be provided as a preformed component and mounted to the system board 201 with an adhesive, die attach, an epoxy or tape. Alternatively, the datum structure 209 can be formed on the system board 201. 3D printing or additive manufacturing can be used to form datum structure 209. In the arrangements, the semiconductor die 206 is directly mounted to the system board 201. In the example arrangement of FIG. 2, the datum structure 209 provides primary, secondary, and tertiary datum features used to accurately place the active array 213 for use in an optical path. Proper positioning of the active array 213 on the semiconductor die 206 is needed for optical systems, as the active array 213 lies in an optical path and is optically coupled to other optical elements in the system. Datum structure 209 provides alignment datum features that allow proper positioning of the active array 213 relative to other optical elements. The datum structure 209 includes designated features 205 on the surface of the datum structure 209 facing away from the system board. The designated features 205 define a plane used with a primary datum, sometimes referred to as "Datum A." In an example where the semiconductor die 206 is a digital micromirror device that is used as a spatial light modulator, the primary datum, Datum A, indicates a Z-axis plane parallel, or at another prescribed angle, to the surface plane of the devices in active array 213. When the active array 213 and semiconductor die 206 are properly aligned in the Z axis direction, the designated features 205 will lie in, or at a precise distance from and parallel or at another prescribed angle to, a Z-plane defined by Datum A.

The datum structure 209 also includes a notch 203 at a first end of datum structure 209, which provides secondary datum features. The secondary datum features are used to locate the active array 213 at a particular point in an X-Y orientation in the Z-plane determined by Datum A. The X-Y orientation is sometimes referred to as "Datum B." The notch 203 includes features that can be used to position the elements with respect to Datum B. Notch 203 has opposing slanted sides 251, 253. Using an ideal radius (circle) centered at a reference point that is a predetermined distance from notch 203, Datum B provides an X-Y coordinate reference position for the active array within the Z-plane determined by the primary datum, Datum A. Notch 203 can be, in addition to the opposing slanted sides and notch shown, a pin or hole.

The datum structure 209 further includes a notch 207 at a second end of datum structure 209. The notch 207 defines a tertiary datum feature, sometimes referred to as "Datum C." The notch 207 has a flat edge 218 that provides rotation information of the active array 213 around the X-Y reference point 252 from Datum B and within the Z-plane of Datum A. The edge 218 of the notch 207 can be used with a line provided by Datum C to orient the array of micromirror devices. The notch 207 can be a pin or a hole, instead of a notch. By using the primary, secondary, and tertiary datum features of the datum structure 209, the active array 213 on semiconductor 206 can be accurately placed with respect to an optical path in a system, which can be a projector, for example.

The datum structure 209 further includes wells 215 and 217. Wells 215, 217 are openings extending through the datum structure 209 that are sized to correspond to bond finger locations (not shown) on the system board 201. Well 215 has three sides 241, 243, 245 that are sides of the datum structure 209, and a fourth side 247 that is a side of the semiconductor die 206. Well 217 has three sides 240, 242, 244 that are sides of the datum structure 209, and a fourth side 246 that is a side of semiconductor die 206. In mounting the semiconductor die 206 to the system board 201, conductors (not shown) will be formed that make electrical connections from bond pads 211 on the device side surface of the semiconductor die 206 to bond fingers on the system board 201 (see conductors 314 in FIG. 4B). A mold compound will be dispensed in the wells 215, 217 to form a dielectric material that covers the conductors, the bond pads, and the bond fingers. In an example the dielectric material can be a glob top mold compound and can be dispensed as a liquid or gel. In another example the dielectric material can be a thermoset epoxy resin mold compound. The wells 215, 217 are used to contain the mold compound in a desired area while it is dispensed and until it is cured. The wells 215, 217 keep the mold compound from "running out", a problem which occurs in assembly when mold compound flows beyond an intended area when it is dispensed as a liquid or gel, and before it can be cured. Thus, the datum structure 209 provides the wells 215, 217 and the datum features 205, 203, and 207. The datum structure 209 has a thickness T1 extending above the device mounting surface of the system board 201 that approximately corresponds to the thickness of the semiconductor die 206, the interposer 208 and the cover 212, in an example the thickness T1 was about 1.5 millimeters. This thickness T1 can vary with the thickness of the semiconductor die 206 and the thickness of the glass cover 212. The datum structure 209 can be formed of a tape, a film, a plastic, a polymer, a ceramic, a metal, and can be provided as a pre-form or can be formed on the system board 201, for example 3D printing can be used to form datum structure 209. In an example a preformed datum structure of a polymer material was used. In an example, the datum structure 209 has a width W1 of about 7 millimeters, and a length L1 of about 14 millimeters, although these dimensions can vary with the material used and with the size of the semiconductor die 206. Use of the datum structure 209 with the semiconductor die 206 provides the primary, secondary and tertiary datum features needed to properly position the active array 213 in an optical system, and also provides wells 215, 217 to contain mold compound that protects bond wire connections between the semiconductor die 206 and the system board 201. The datum structure 209 has thickness T1 that is reduced when compared to the thickness used for mounting a packaged semiconductor device to a system board. The reduced dimension in the Z-direction reduces the volume in the vertical or Z direction required for the system. Use of the arrangements saves costs by replacing a ceramic substrate and other packaging materials used in a semiconductor device package with the datum structure 209, and reduces the volume and space needed for an optical system including semiconductor die 206. Use of the arrangements also can increase thermal dissipation from the semiconductor die 206, as in the arrangements, the semiconductor die 206 is mounted to the system board 201 with a thermally conductive die attach, providing a direct thermal path from the semiconductor die 206.

In an alternative approach, the datum structure 209 can be formed on a backside surface of the system board, while the semiconductor die 206 is mounted to the device side surface of the system board 201, so that the datum alignment features are provided on the opposing surface of the system board. Wells to contain the mold compound around the bond fingers in this alternative would be formed at ends of the semiconductor die 206, while the datum structures are formed on the backside surface.

Figure 2B:
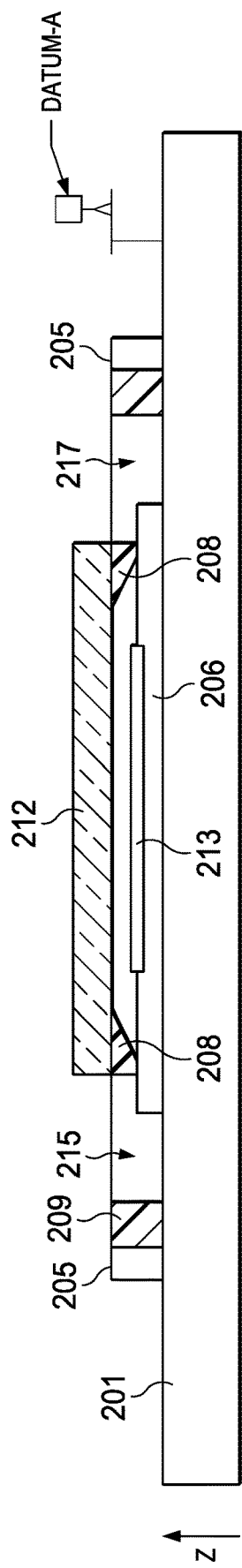
FIG. 2B illustrates, in a cross section, a semiconductor die mounted to a system board with datum features.

FIG. 2B is a cross sectional view of the datum structure 209 that is illustrated to further describe how the designated features 205, the primary datum features, can be used to provide the Datum A alignment in the Z-plane. The semiconductor die 206 is shown mounted to system board 201. The datum structure 209 is shown mounted to system board 201, with semiconductor die 206 in a central portion. Wells 215 and 217 extend through the datum structure 209 and provide areas for wire bond connections to the system board 201. Semiconductor die 206 is mounted to system board 201. Cover 212 is mounted over the device side surface of semiconductor die 206 by interposer 208. Active array 213 is formed on the device side surface of the semiconductor die 206. The designated features 205 on the surface of the datum structure 209 provide three (or four) points to define a plane that is aligned to Datum A, which indicates a Z-plane location where the active array 213 is to be located, or placed parallel or at a designated angle to. Datum A can be a Z axis location above system board 201 that indicates a Z-plane location that is parallel or at another prescribed angle to the plane the active array 213 is to be located in, when the active array 213 is correctly positioned.

Figure 2C:
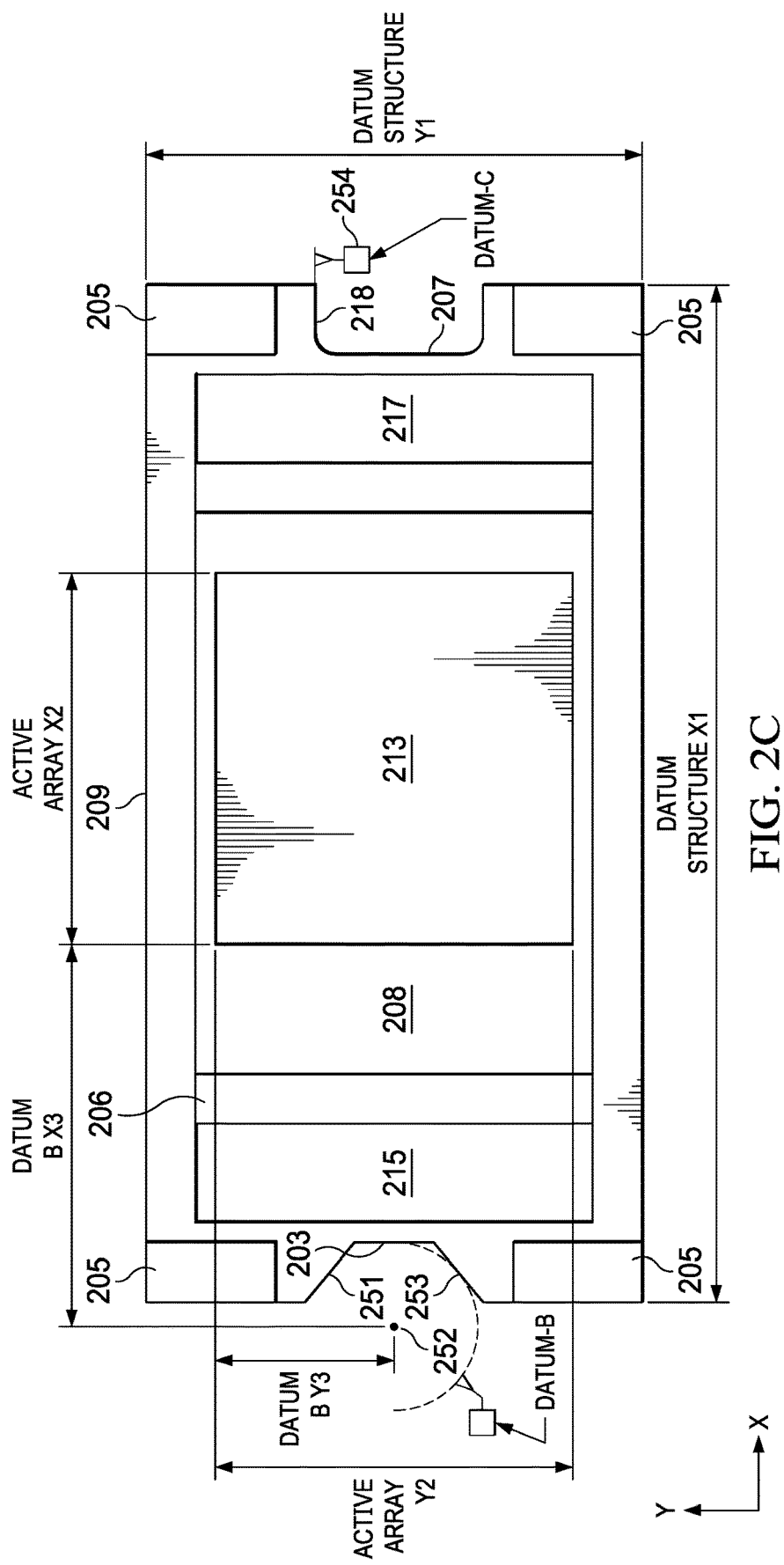
FIG. 2C illustrates, in a plan view, the semiconductor die and system board of FIG. 2B, with datum features.

FIG. 2C is a plan view of the datum structure 209 with semiconductor die 206 provided to illustrate the use of the secondary and tertiary datum features to position the active array 213. The datum structure 209 is shown looking from above, with semiconductor die 206 positioned in a central opening of datum structure 209, and active array 213 shown with interposer 208 surrounding it. The wells 215 and 217 are shown at each end of the semiconductor die 206 to provide an area for wire bonds to be formed between the semiconductor die 206 and the system board 201. In FIG. 2C a Y axis and an X axis are shown perpendicular to one another.

When the active array 213 is properly aligned to the Z-plane using Datum A as shown in FIG. 2B, the active array 213 needs to be positioned at the proper X, Y coordinates and aligned to an optical path. In FIG. 2C, the notch 203, with symmetrical opposing slanted sides 251, 253, provides a secondary datum feature. Datum B is an ideal radius (a circle) with an origin at a specified X,Y coordinate reference point 252. When the datum structure 209 and the active array 213 are properly positioned with respect to the reference point 252, an ideal radius centered at reference point 252 will have sides that touch, but do not cross the slanted sides 251, 253 of notch 203, which form tangents to the ideal radius. The ideal radius of Datum B is not a physical element but instead provides a method for correctly positioning the active array 213 with respect to the reference point 252. In an example, the radius of Datum B has a diameter of 2.5 millimeters, this is just one example. As oriented in FIG. 2C, the left edge of the active array 213 is spaced in the X direction from the reference point by a predetermined distance, labeled Datum B X3, which is in one example about 5.4 millimeters, with a +/−0.075 tolerance. The active array 213 has an X axis length labeled Active Array X2, in this example, of about 4.86 millimeters. The active array 213 has a Y axis width that is labeled Active Array Y2, of about 4.86 millimeters. The reference point 252 has a Y axis distance from the top edge (as shown in FIG. 2C) of the active array 213 of about 2.5 millimeters with a tolerance of about 0.075 millimeters. The datum structure 209 has a Y axis width labeled Datum Structure Y1, in the example, of about 6.9 millimeters with a tolerance of about 0.075. The datum structure 209 has an X-axis length labeled Datum Structure X1 of about 13.97 millimeters with a tolerance of about 0.075. Using the secondary datum features of notch 203, including sides 251 and 253, the active array 213 can be properly positioned relative to the X,Y coordinates of reference point 252.

However, more information is needed to align the active array 213, as it can be rotated about the reference point 252 of Datum B and the sides 251, 253 of notch 203 can still meet the radius of Datum B, so to complete the positioning a tertiary datum feature is used with Datum C. The notch 207 provides the tertiary datum feature. In an example notch 207 has a width in the Y direction of about 2.5 millimeters with a tolerance of 0.075. The dimensions for this example are illustrative and will change with changes in the size of the active array 213, the semiconductor die 206, or the datum structure 209. Datum C is shown as 254 in FIG. 2C as a line in the X-axis direction extending parallel to the top edge of the active array 213. When the active array 213 is positioned as intended, rotating the datum structure 209 about the Datum B reference point 252, at the correct rotation the line 254 for Datum C will intersect the inside surface of the edge 218 of notch 207. The datum structure 209 and the active array 213 can be accurately positioned with respect to an optical path when the three datums, Datum-A, Datum-B and Datum-C, are used with the primary, secondary and tertiary datum structures, designated features 205, the sloping sides 251, 253 of notch 203, and edge 218 of notch 207. In this way, the datum structure 209 of the example arrangement provides the alignment structures that would otherwise be provided by a semiconductor device package, without the need for the semiconductor device package. A reduction in thickness and reduced volume for the system is achieved by use of the arrangements.

Figure 3A:
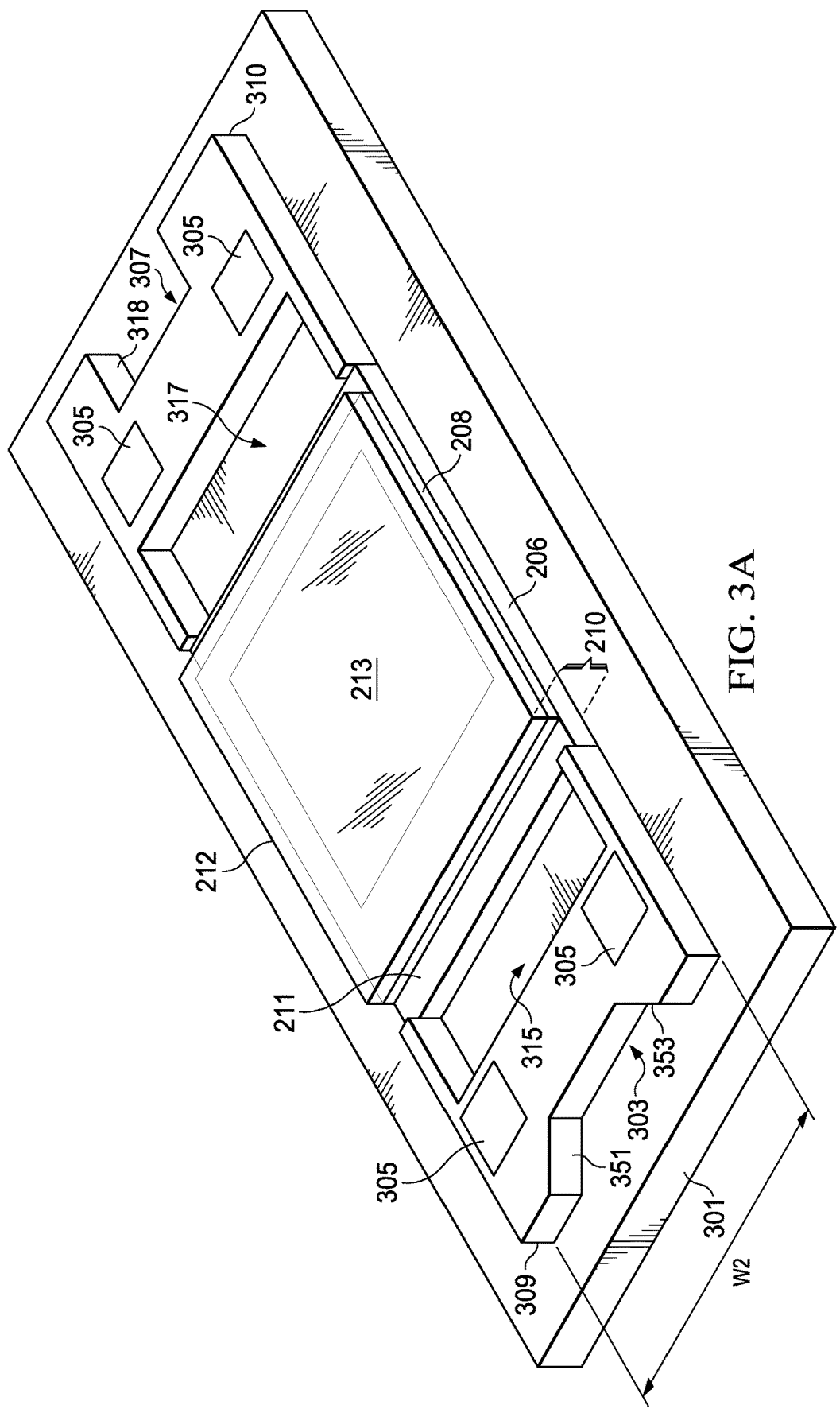
Figure 3B:
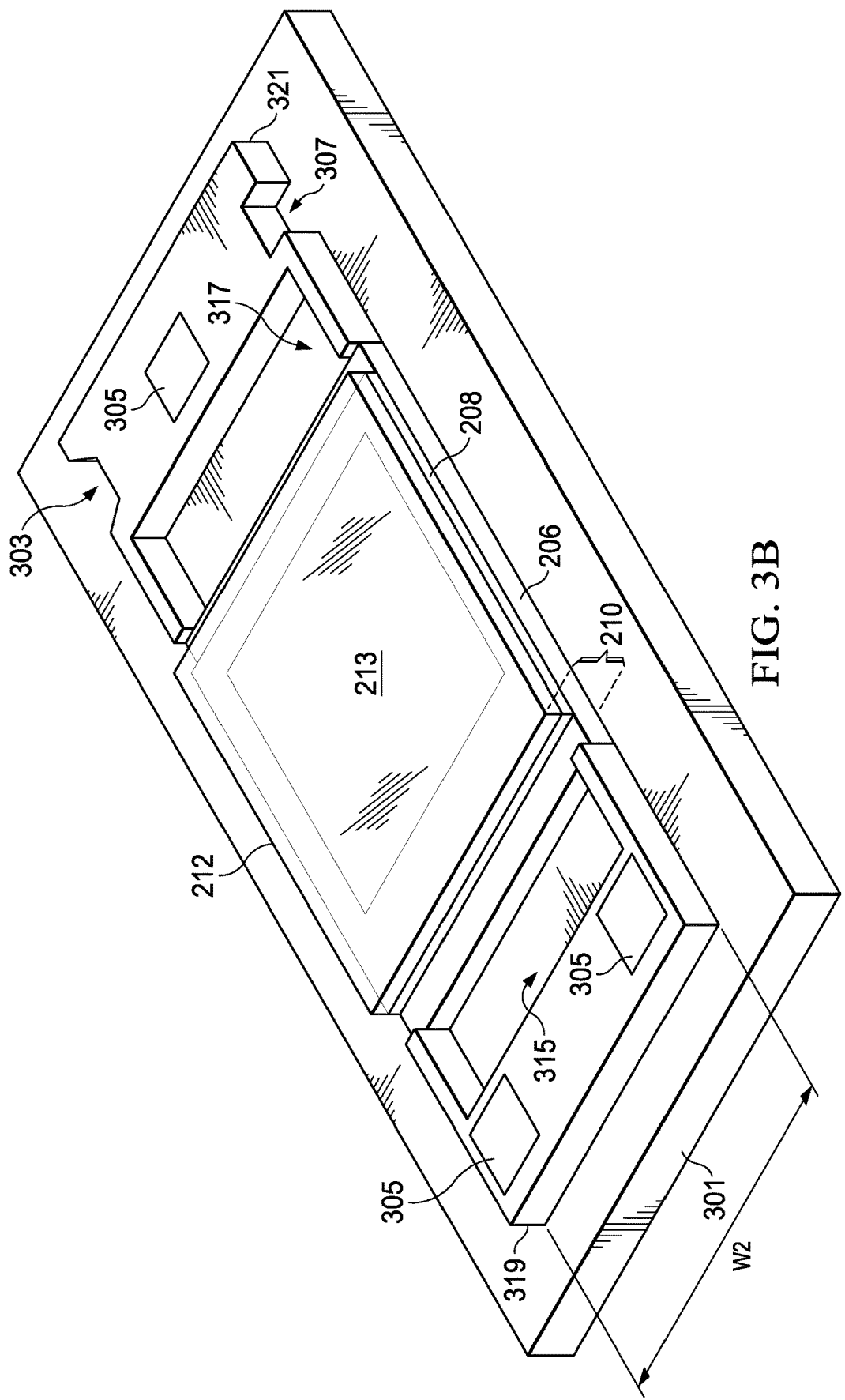

FIGS. 3A-3C are a projection views illustrating alternative arrangements. In FIG. 3A, the semiconductor device 210 including semiconductor die 206 is mounted on a system board 301, which can be a printed circuit board similar to the system board 201 in FIG. 2. For example, system board 301 can be a fiber reinforced epoxy board such as flame retardant 4 (FR4). The semiconductor die 206 can be an optical semiconductor die with an active array 213. A cover 212 is mounted over the semiconductor die 206 with an interposer 208, and the cover 212 covers a portion of the semiconductor die 206. The semiconductor die 206, interposer 208, active array 213 and cover 212 are included in semiconductor device 210. Conductors (not shown for clarity, see 314 in FIG. 4B) will electrically connect bond pads on the semiconductor die 206 to the system board 301. A first datum structure 309 with a well 315 is placed at one end of the semiconductor die 206, with designated areas 305 on an upper surface of the datum structure 319. The designated areas 305 provide primary datum features corresponding to the Z-plane for Datum A described above. The designated areas 305 define a Z-plane that is parallel or at another prescribed angle to a surface plane of digital micromirror devices in active array 213 on the surface of semiconductor die 206. The first datum structure 309 includes notch 303, which provides the secondary datum structure with slanted edges 351, 353 for use with orienting the active array 213 with Datum B features, as described above.

A second datum structure 310 is placed at the opposite end of the semiconductor die 206. The second datum structure 310 includes a well 317 which corresponds to bond fingers on system board 301 that are configured for electrical connection to semiconductor die 206. The second datum structure 310 includes a designated feature 305 that is used with the other designated features 305 on the first datum structure 309. The second datum structure 310 further includes notch 307 that is similar to the notch 207 in FIG. 2. The datum structure 310 includes an edge 318 of notch 307 that provides the rotation orientation for the semiconductor die 206 within the Z-plane defined by the designated surfaces 305 as described above. The second datum structure 310 includes an opening forming the sides of a well 317 that is configured to receive a mold compound. When compared to the arrangement of FIG. 2A, the datum structures 309 310 have a width W2 that is less than the width W1 of FIG. 2A, further reducing the board area required for mounting the semiconductor die 206. In an example, the width W2 can be about 5 millimeters, about the same width as semiconductor die 206, +/−10%. In FIG. 3A, first datum structure 309 and second datum structure 310 are positioned in alignment to ensure the relative positions of notch 303 and notch 307, which provide the secondary and tertiary datum features, are correct.

In FIG. 3B, an alternative arrangement includes a semiconductor die 206 mounted on a system board 301, which can be a printed circuit board similar to the system board 201 in FIG. 2. For example, system board 301 can be a fiber reinforced epoxy board such as flame retardant 4 (FR4). The semiconductor die 206, interposer 208, active array 213 and cover 212 can be provided as a semiconductor device 210. Conductors (not shown for clarity, see FIG. 4B) will electrically connect bond pads on the semiconductor die 206 to the system board 301. A first datum structure 319 with a well 315 is placed at one end of the semiconductor die 206, with designated features 305 on an upper surface of the first datum structure 319. The designated features 305 provide primary datum features corresponding to Datum A described above. The designated features 305 define a Z-plane that is parallel or another prescribed angle to a surface plane of digital micromirror devices in active array 213 on the surface of semiconductor die 206. A second datum structure 321 is placed at the opposite end of the semiconductor die 206. The second datum structure 321 includes a well 317 which corresponds to bond fingers on system board 301 that are configured for electrical connection to semiconductor die 206. The second datum structure 321 includes a designated feature 305 that is used with the other designated features 305 on the first datum structure 319. The second datum structure 321 further includes notch 303 which is similar to notch 203 in FIG. 2, and a notch 307 that is similar to the notch 207 in FIG. 2. Notch 303, a secondary datum feature, provides position alignment using Datum B features as described above. The datum structure 321 includes notch 307, which has an edge that provides the rotation orientation for active array 213 when used with the Datum C features as described above. The second datum structure 321 includes an opening forming the sides of a well 317 that is configured to receive a mold compound.

By providing both the secondary datum feature of notch 303 and the tertiary datum feature of notch 307 on the second datum structure 321, a need for precise alignment between the second datum structure 321 and the first datum structure 319 is reduced, when compared to the arrangement of FIG. 3A. The two datum structures 319, 321 can be more readily placed on the system board 301, with relaxed tolerances, than in the arrangement of FIG. 3A. The arrangement of FIG. 3B also has width W2, which is less than the width W1 in FIG. 2A, so that use of the arrangements with separate first and second datum structures, which do not surround the sides of semiconductor die 206, reduces the board area needed.

FIG. 3C illustrates, in a projection view, and FIG. 3CC illustrates in a close up view, another alternative arrangement. In FIG. 3C, semiconductor device 210 includes the semiconductor die 206, the interposer 208, the active array 213, and the cover 212, as shown in FIG. 3B. The first datum structure 319 and the second datum structure 321 are placed at opposite ends of the semiconductor die 206. The wells 315 and 317 are formed by the first datum structure 319 and the second datum structure 321, as in FIG. 3B. However, in the arrangement of FIG. 3C, a modification is made where a gap 350 is between the datum structure 319, and semiconductor die 206; and between datum structure 321, and the semiconductor die 206. By allowing gap 350 between the datum structures 319, 321 and the semiconductor die 206, additional freedom in placement of the datum structures 319, 321 is provided, the tolerance in spacing between the elements is relaxed. FIG. 3CC illustrates a close up of the gap 350 between the second datum structure 321 and the semiconductor die 206. In one approach, the bond wires are left exposed without mold compound. If the need to cover the bonds in the wells 315, 317 with mold compound arises to better protect the conductors, the gaps 350 may be filled prior to the encapsulation using an epoxy, such as a high viscosity epoxy, to contain the mold compound. The gap 350 can be used with any of the arrangements disclosed herein, to create additional alternative arrangements.

Figure 4A:
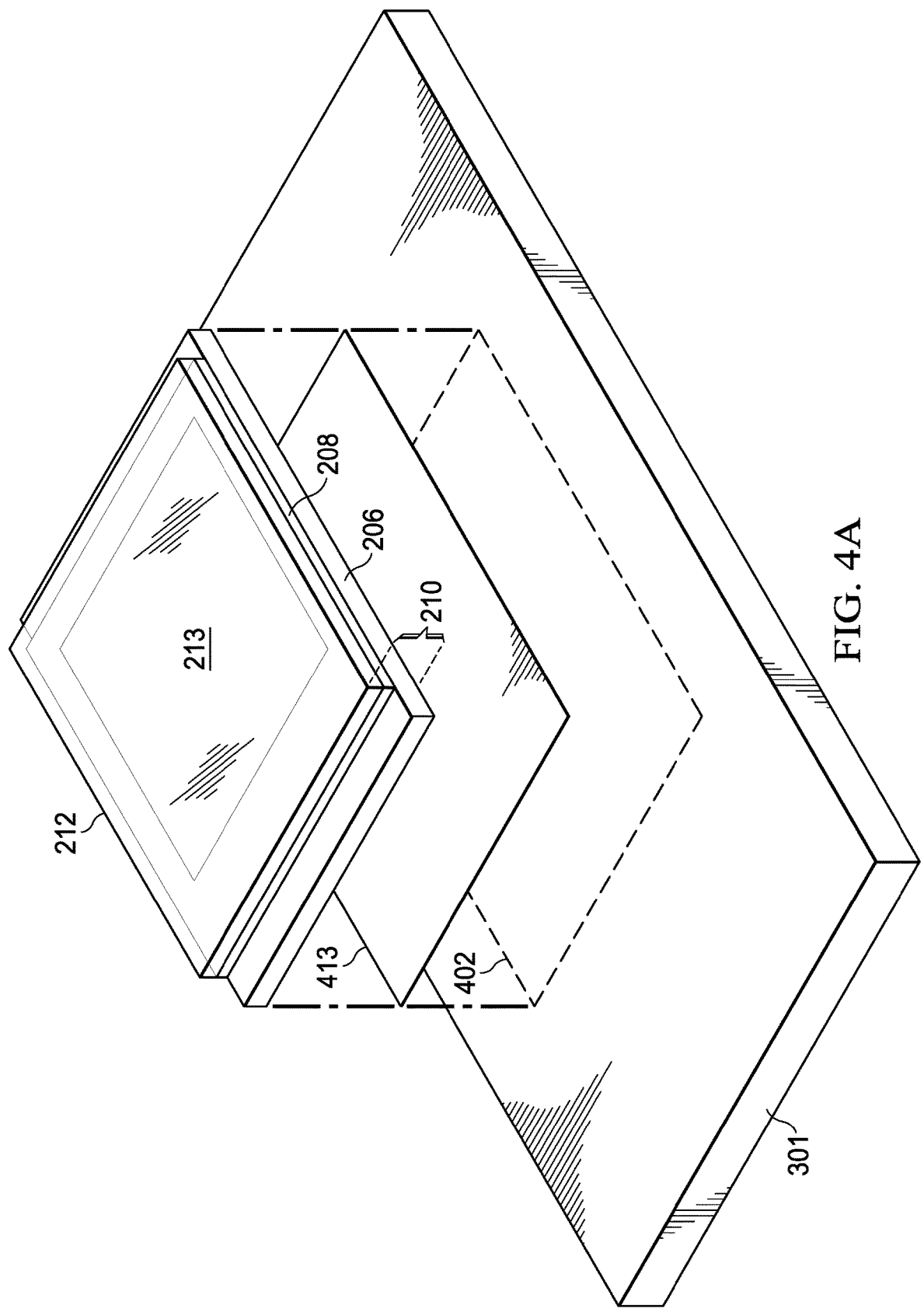
FIGS. 4A-4E illustrate, in a series of projection views, selected steps for forming an arrangement.

FIGS. 4A-4E illustrate, in a series of projection views, selected steps of methods for forming the arrangements of FIGS. 3A-3B. Similar method steps can be used to form the arrangement of FIG. 2, the difference being that in FIG. 2, the datum structure 209 is provided as one piece, while in FIGS. 3A-3B, datum structures (309, 310 in FIG. 3A, 319, 321 in FIG. 3B) are provided in two pieces. In FIG. 4A, a semiconductor device 210 including a semiconductor die 206, interposer 208, active array 213, and a cover 212 is shown being mounted to system board 301 in a die mount area 402 using a die attach 413. Die attach 413 can be a die attach film, which can be a non-conductive die attach film or conductive die attach film. Alternatively, a die attach paste or epoxy material can be used for die attach 413. The die attach 413 is thermally conductive. In the arrangements, by direct mounting the semiconductor die 206 to the system board 301, thermal dissipation from the semiconductor die 206 to the system board 301 can be improved (when compared to mounting a packaged semiconductor device or module to the system board without use of the arrangements).

Figure 4B:
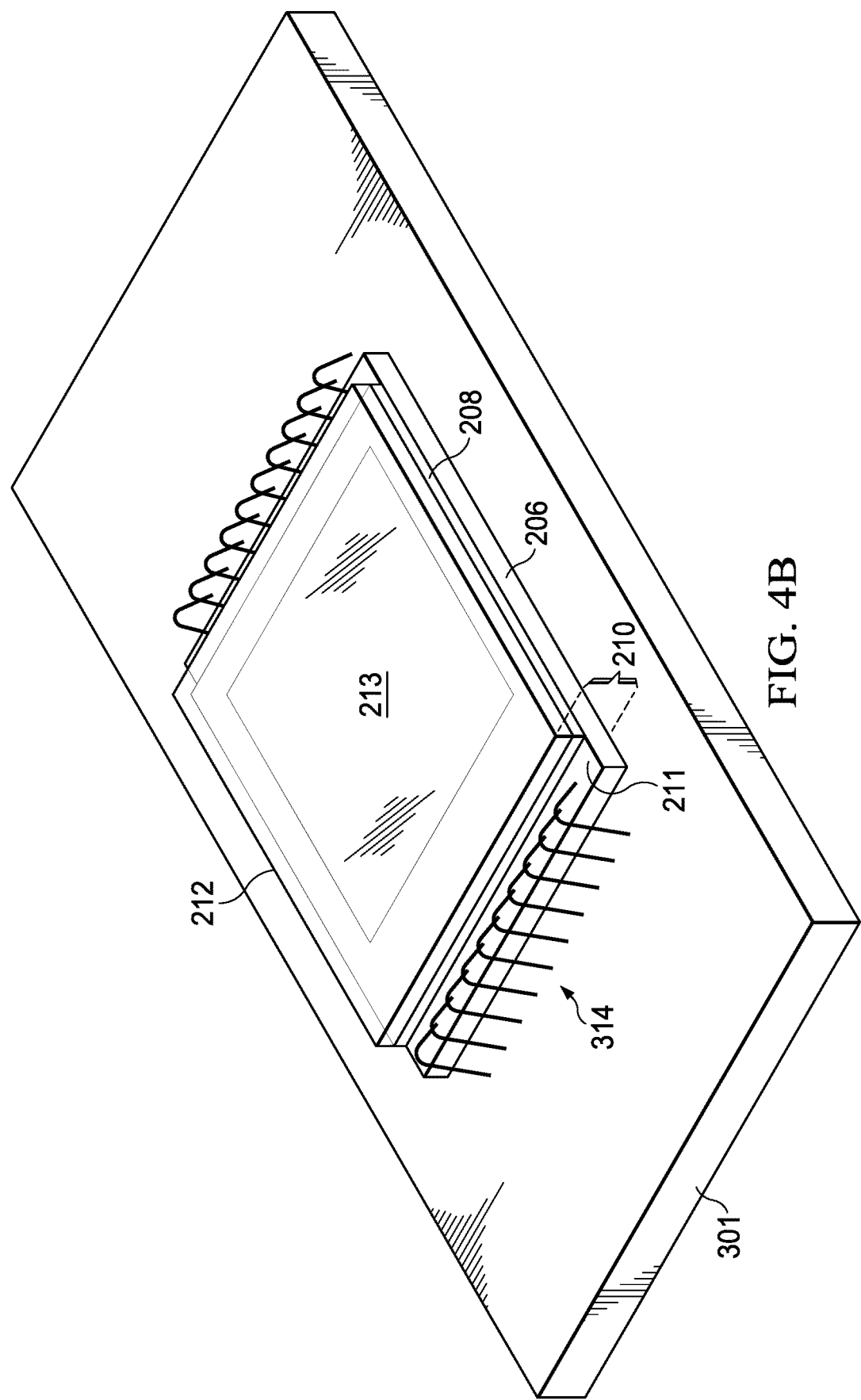

FIG. 4B illustrates the semiconductor device 210 and the system board 301 after additional processing. FIG. 4B illustrates conductors 314 that are formed between bond pads 211 on semiconductor die 206 and bond fingers (not visible) on the system board 301. The conductors 314 can be bond wires. In a wire bonding process, a bond wire extends through a capillary in a wire bonding tool. A flame or heat source is used to form a free air ball at the end of the bond wire. The ball is brought into contact with a bond pad on a semiconductor die and pressure, sonic energy, or a combination of these is used to bond the ball to the bond pad. As the capillary tool moves away from the ball bond formed on the bond pad of the semiconductor die, the bond wire extends and forms an arc shaped conductor. The capillary in the wire bonder tool then brings the bond wire into contact with a bond finger, and pressure is used to form a stitch bond on the bond finger, the tool then breaks the end of the bond wire at the stitch bond. The process repeats for each bond wire; this process is referred to as "ball and stitch" bonding. In an alternative approach, conductors 314 can be formed using ribbon bonds.

Figure 4C:
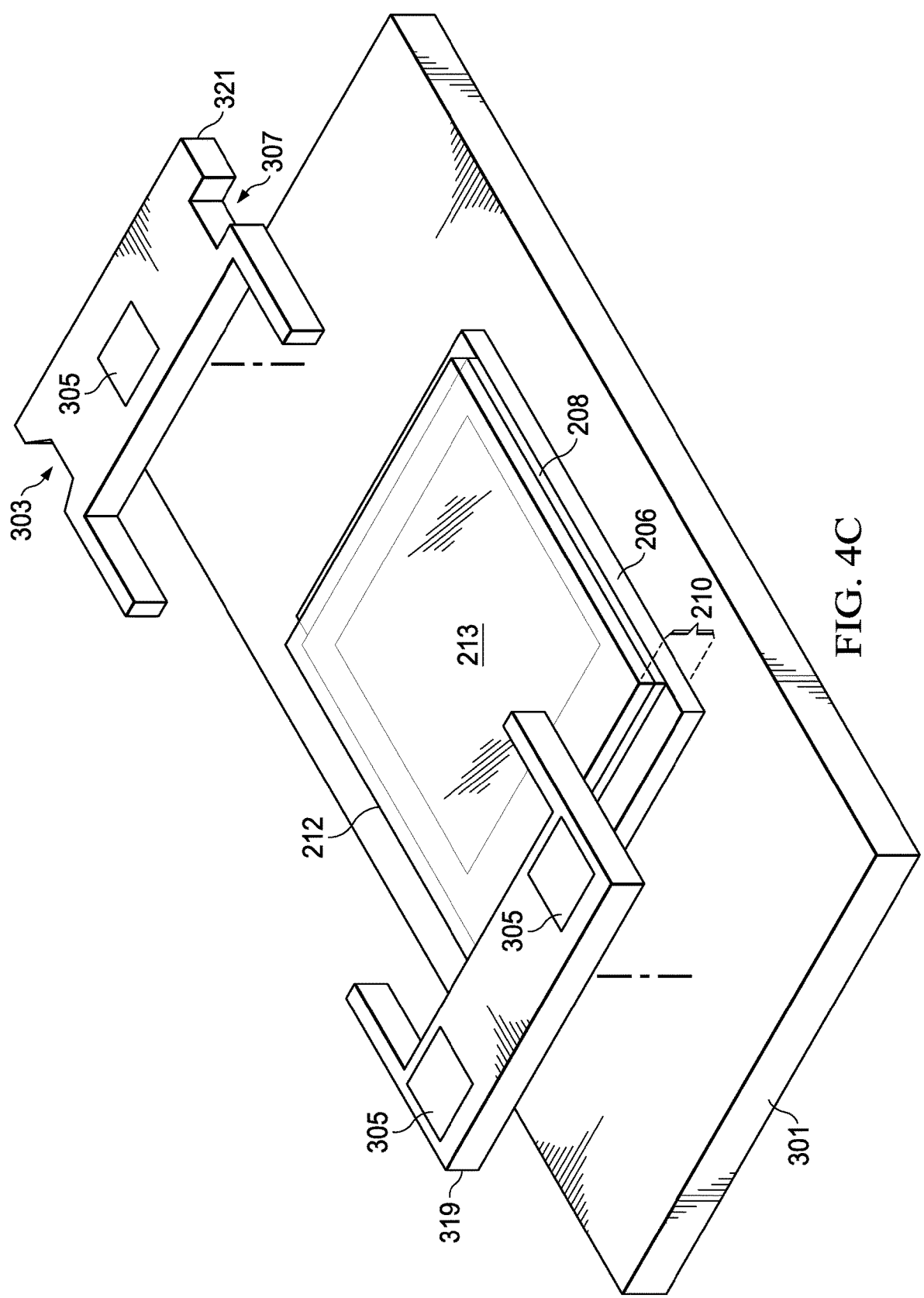

FIG. 4C illustrates the semiconductor device 210 and the system board 301 after additional processing. Note that in FIG. 4C, the conductors 314 shown in FIG. 4B are not shown. This illustrates that in one method, as shown in FIG. 4B, the conductors 314 are formed before the process of FIG. 4C, where the first and second datum structures 319, 321 are mounted on the system board 301. In an alternative method, shown in FIG. 4C, the conductors 314 are formed after the first and second datum structures 319, 321 are mounted onto the system board 301, and the result of either approach is shown in FIG. 4D.

In FIG. 4C, first and second datum structures 319 and 321 are shown being mounted onto the system board 301 at either end of semiconductor device 210. The first datum structure 319 includes designated features 305 that form primary datum features on the upper surface of the datum structure 319. As described above these datum features are used to align the active array 213 using Datum A, a Z-plane that is parallel or another prescribed angle to a plane of the devices in the active array 213. The second datum structure 321 is shown with a designated feature 305 that is part of the primary datum feature, with notch 303 and notch 307 that form the secondary and tertiary datum features, respectively, as described above and shown in FIGS. 3A-3C.

Figure 4D:
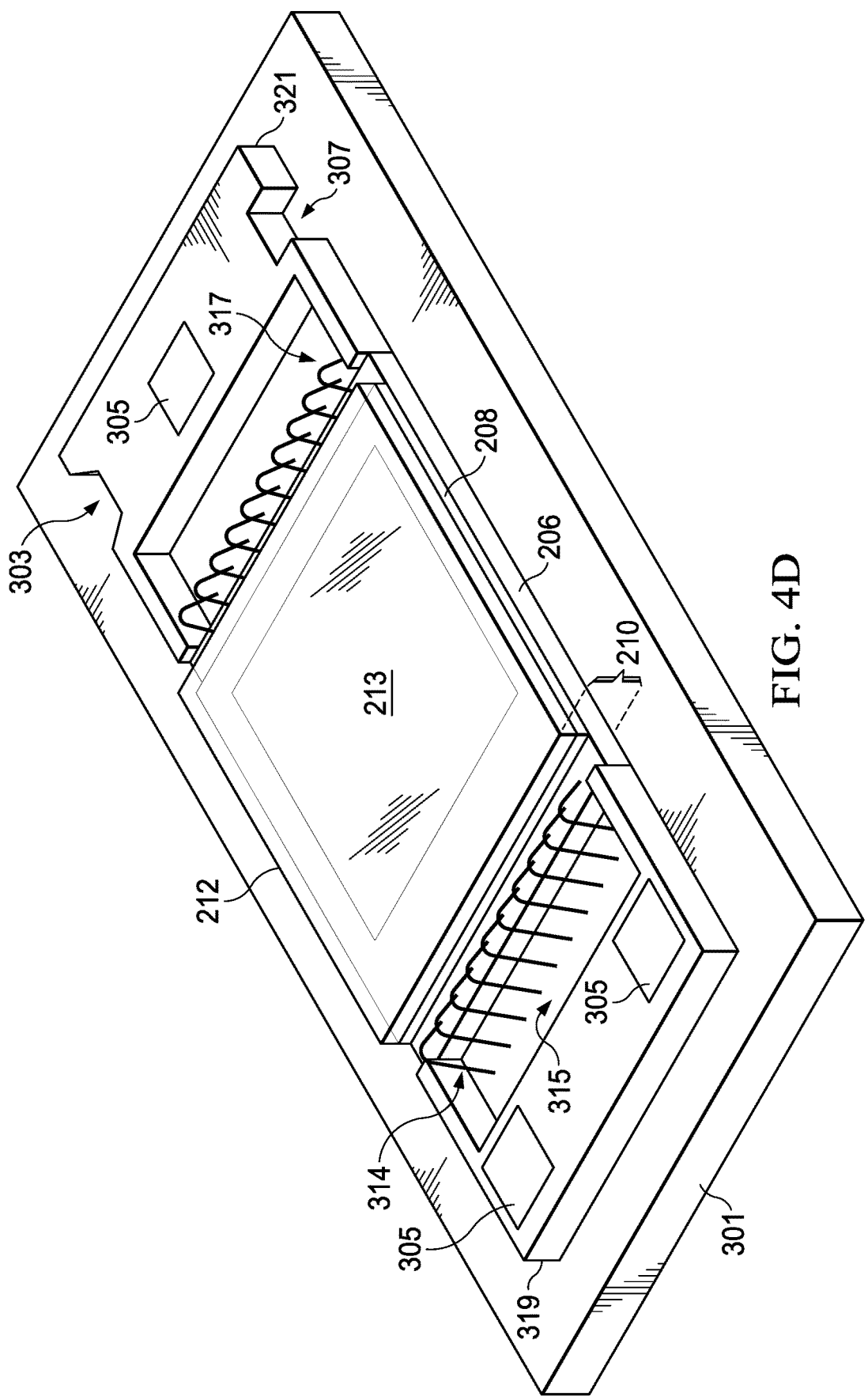

FIG. 4D illustrates the semiconductor device 210 and the system board 301 of FIG. 4C after additional processing. In FIG. 4D, the conductors 314 are shown in wells 315, 317 in the first and second datum structures 319, 321. The conductors 314 can, in one approach, be formed prior to the datum structure mounting step of FIG. 4C, as shown in FIG. 4B. In an alternative approach, the conductors 314 can be formed after the first and second datum structures 319, 321 are mounted on the system board 301 as shown in FIG. 4C. In either approach, after the steps are performed, the elements will be as shown in FIG. 4D, with the conductors 314, which can be bond wires, coupled between the semiconductor die 206 and the system board 301, and the bond wires couple to the system board 301 within the wells 315 and 317. The designated features 305 define a plane that is a primary datum, the notch 303 provides the secondary datum, and the notch 307 provides the tertiary datum, as described above.

Figure 4E:
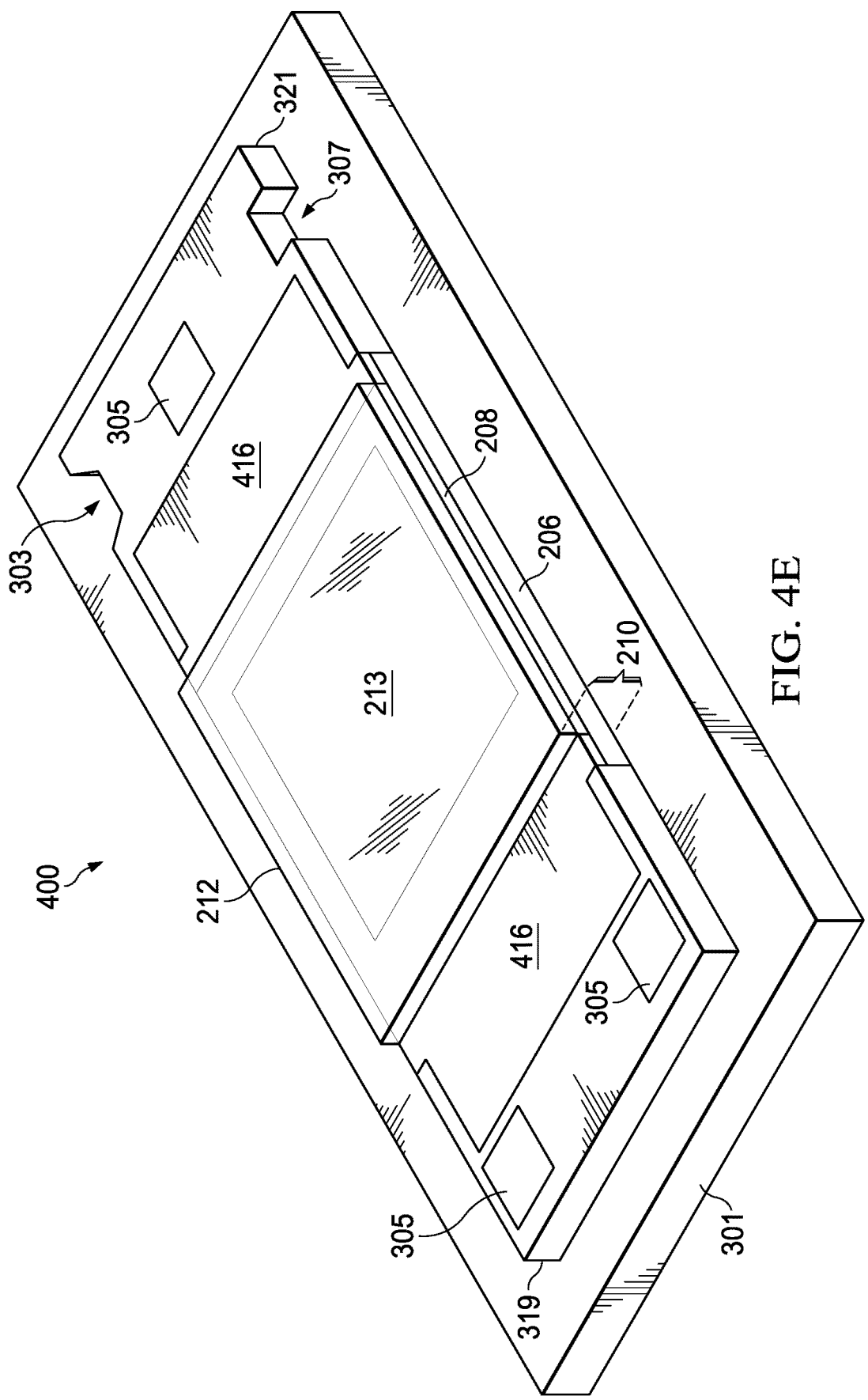

FIG. 4E illustrates, in another projection view, a completed mounted semiconductor device 400 including the semiconductor device 210, with the semiconductor die 206, the interposer 208, the active array 213, and the cover 212, and the system board 301, after a molding process. In transitioning from FIG. 4D to FIG. 4E, a mold compound, such as a glob top mold compound, is deposited into the wells 315, 317 (see FIG. 4D) and subsequently cured to form a solid mold compound 416 over the conductors 314, and the bond pads 211 on semiconductor die 206. In one approach, the mold compound is dispensed as a liquid or gel and is subsequently cured using UV, thermal, or time cure processes. The cure process selected depends on the type of mold compound selected. The mold compound 416 covers and protects the conductors 314 (see FIG. 4C), the bonds on the semiconductor die, and the bonds on system board 301. The first and second datum structures 319, 321 provide the datum features as described above, so that with the mold compound 416, the first and second datum structures 319, 321 provide the features that would have been provided by a package substrate if the advantageous approach of the arrangements was not used. In contrast, by use of the arrangements, the need for a package substrate is obviated, and the semiconductor die 206 is direct mounted to the system board 301, reducing costs, reducing parts, increasing thermal performance, and eliminating redundant features of the package substrate. By using thermally conductive die attach to directly attach the semiconductor die 206 to the system board 301, the thermal dissipation can be increased, when compared to mounting packaged semiconductor devices or modules. By reducing the thickness of the mounted semiconductor device, and by reducing the board area used, the use of the arrangements can reduce the volume needed for an optical system when compared to mounting a packaged semiconductor device to a system board without the arrangements.

Figure 4F:
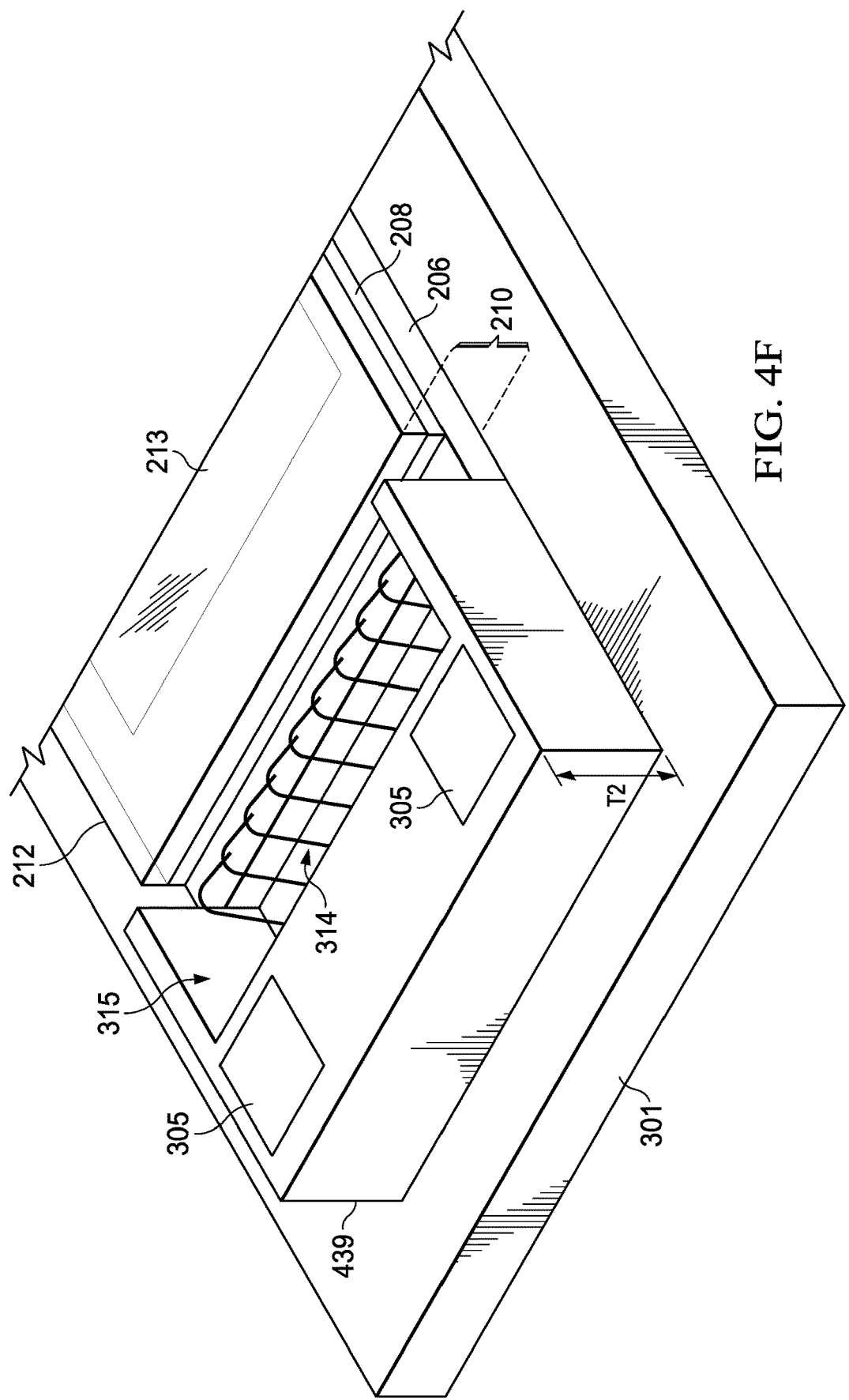
FIG. 4F illustrates, in a projection view, an alternative step for an additional arrangement.

FIG. 4F illustrates, in a close up view, an alternative arrangement to the arrangement of FIGS. 4A-4E. In FIG. 4F, the first datum structure 439 is shown with designated features 305 on an upper surface. A semiconductor device 210 includes a semiconductor die 206, an interposer 208, an active array 213, and a cover 212, semiconductor die 206 is mounted to system board 301. Conductors 314, which are bond wires in this example, are shown connecting semiconductor die 206 to bond fingers (not shown) on system board 301, in well 315. In the arrangement of FIG. 4F, the conductors 314 and corresponding bonds are protected, not by use of a mold compound, but instead by increasing the thickness T2 of the datum structure 439. The increased thickness T2 protects the bond wires from being impacted during processing, and may eliminate the need for the mold compound. This modification, making datum structures with greater thickness, can be applied to each of the datum structures in the disclosed arrangements, to make further arrangements. Use of the thicker datum structures, without the need for mold compound, reduces the overall cost and reduces the number of process steps, increasing throughput. In an additional alternative arrangement, when 3D printing or additive manufacturing is used to form the datum structures, a cover can be printed over the bond wires and bond fingers on the system board, providing the mechanical protection that is provided in other arrangements by the mold compound.

Figure 5:
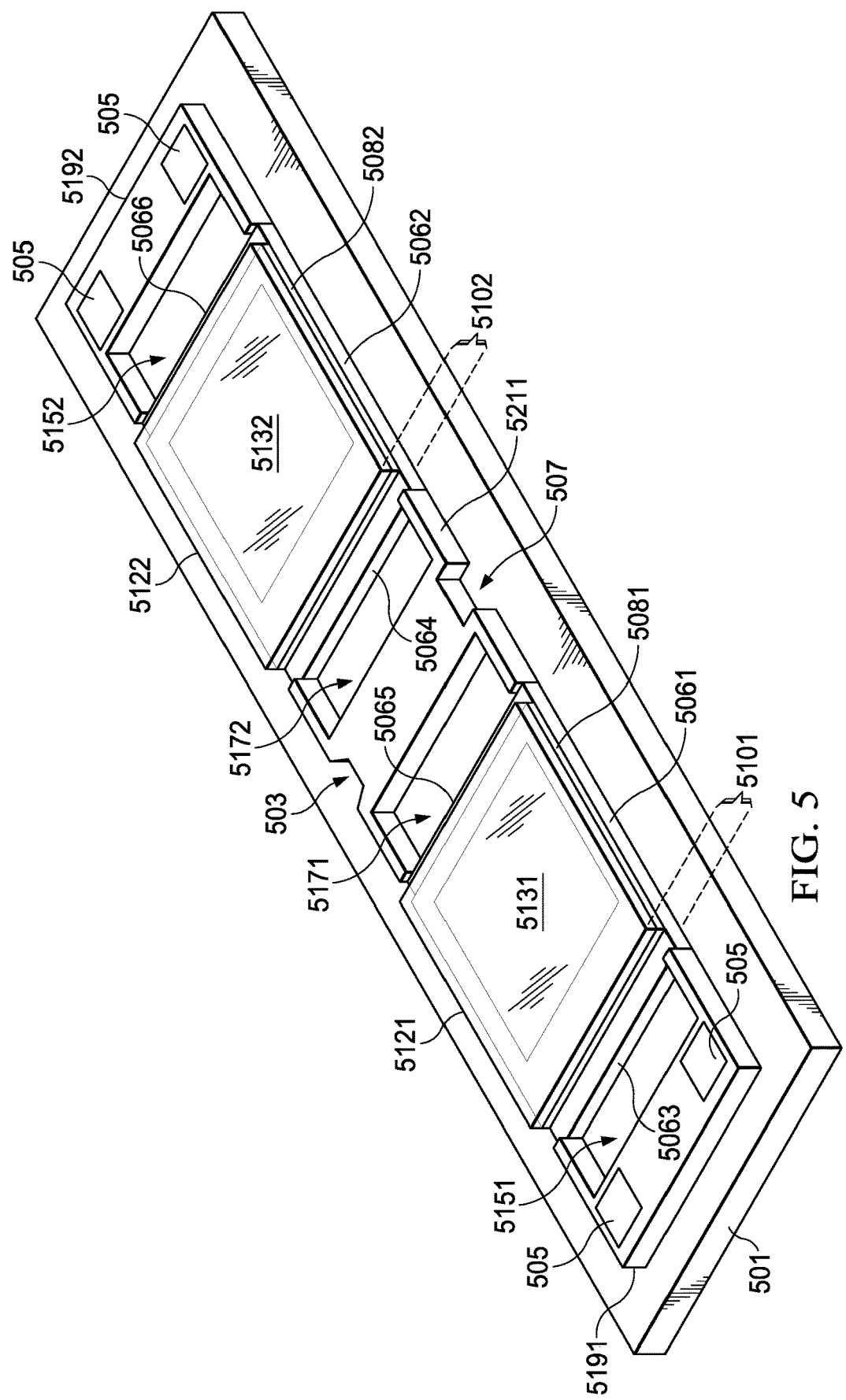
FIG. 5 illustrates in a projection view an alternative arrangement having two semiconductor devices.

FIG. 5 depicts, in another projection view, an alternative arrangement for an application where two semiconductor devices are direct mounted to a system board. In an example, two digital micromirror devices (DMDs) are used for projection. In one example application, a near eye display includes two display areas, one for the right eye and one for the left eye, of a viewer.

In FIG. 5, system board 501 has two semiconductor devices 5101 and 5102 mounted on it. At the stage of the assembly process shown in FIG. 5, a first datum structure 5211 which is between the two semiconductor device dies 5061 and 5062, and second and third datum structures 5191 and 5192 are mounted to the system board 501. The conductors have not yet been formed, and the mold compound has not yet been applied. The semiconductor device 5101 includes semiconductor die 5061, interposer 5081, active array 5131, and cover 5121. The semiconductor device 5102 includes semiconductor die 5062, interposer 5082, active array 5132, and cover 5122. A first datum structure 5211 is between the two semiconductor device dies 5061 and 5062. The semiconductor die 5061 has a first end 5063 and a second opposite end 5065. The semiconductor die 5062 has a first end 5064 and a second end 5066. The first datum structure 5211 is between the second end 5065 of the first semiconductor die 5061 and the first end 5064 of semiconductor die 5062. The second datum structure 5191 and the third datum structure 5192 include designated features 505, which are primary datum features for use with Datum A. The second datum structure 5191 has a well 5151. The well 5151 provides an area where bond fingers on the surface of the system board 501 can be connected to semiconductor die 5061 of semiconductor device 5101. The third datum structure 5192 has a well 5152. The well 5152 provides an area where bond fingers on the system board 501 can be connected to the semiconductor die 5062 of semiconductor device 5102.

The first datum structure 5211 is shown in FIG. 5. The first datum structure 5211 has two openings to form wells 5171 and 5172. Each of the wells 5171 and 5172 provide areas where bond fingers (not shown) on the system board 501 can be coupled to semiconductor dies 5061 and 5062. In addition, first datum structure 5211 provides two datum features, a secondary datum feature is provided by the notch 503, that corresponds to notch 303 described above, and a tertiary feature is provided by notch 507, that corresponds to notch 307 described above. By providing the datum features for two semiconductor dies 5061, 5062 using a shared first datum structure 5211, the area used on the system board for the two semiconductor devices 5101 and 5102 is reduced, the number of components is reduced, and the system can be smaller in size when compared to an arrangement where the two semiconductor dies would each have two datum structures.

Figure 6:
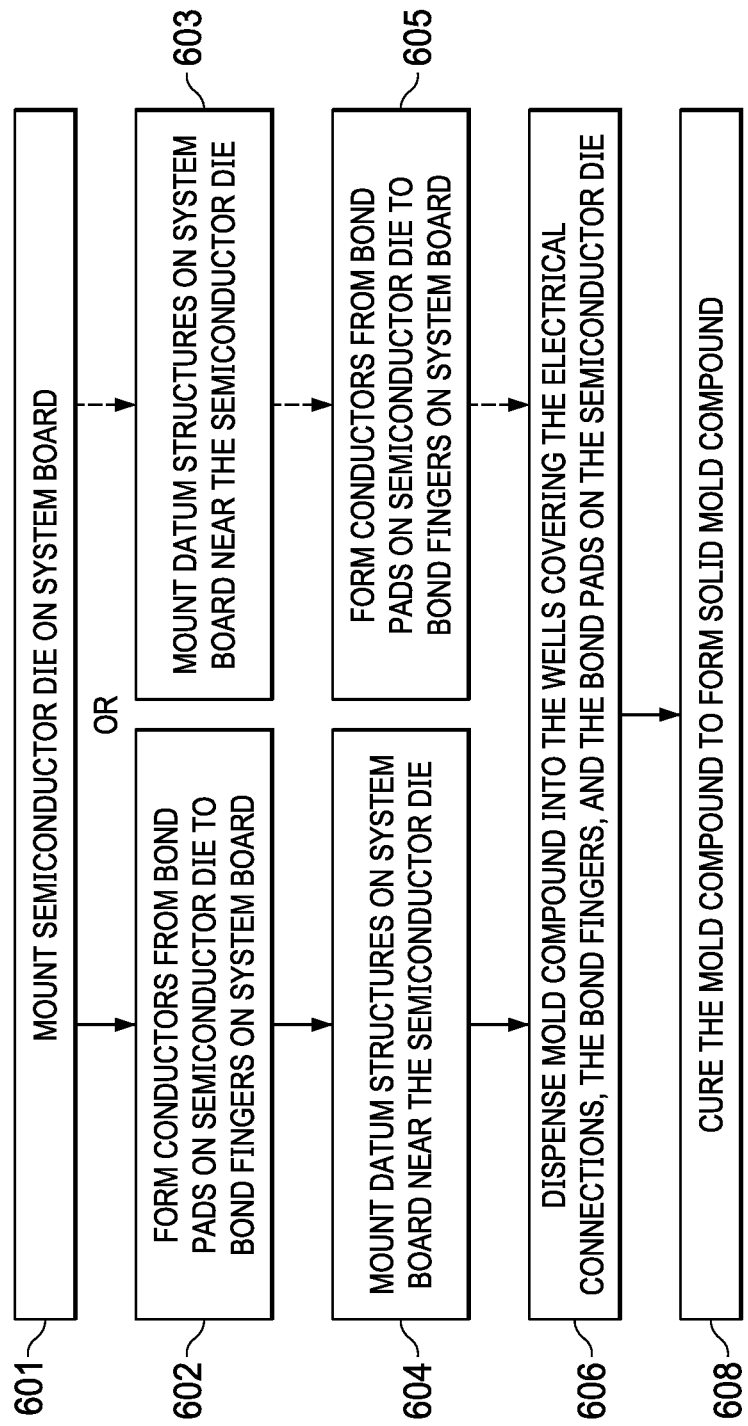
FIG. 6 illustrates, in a flow diagram, method steps for forming arrangements.

FIG. 6 illustrates, in a flow diagram, selected steps of methods for forming an arrangement. As shown in FIG. 6, an alternative path is indicated by the dashed arrows, to illustrate alternative orders of steps in the methods. In one approach, step 602 follows step 601, and conductors are formed connecting bond pads on the semiconductor die to bond fingers on the system board. At step 601, semiconductor die are mounted on a system board (see semiconductor die 206 in FIG. 4A). At step 602, conductors are formed between the bond pads of the semiconductor die and bond fingers on the system board. In an example a wire bonder tool is used to form wire bonds (see conductors 314 in FIG. 4B.) At step 604, which follows step 602, datum structures are mounted on the system board near the semiconductor die. (See datum structures 319, 321 in FIG. 4C).

Returning to step 601, in an alternative approach, the step transitions to step 603. At step 603, the datum structures are mounted on the system board near the semiconductor die. (See datum structures 319, 321 in FIG. 4C). At step 605, conductors are formed between bond pads on the semiconductor die and bond fingers on the system board (see 314 in FIG. 4D).

Whether steps 602 and then 604 are performed, or steps 603 and then step 605, the datum structures are mounted on the system board with openings that form wells (see wells 315, 317 in FIG. 4D). At step 606, mold compound, which can be a glob top mold compound that is dispensed as a liquid or gel, is dispensed into the wells covering the conductors, the bond fingers on the system board, and the bond pads on the semiconductor die. At step 608, the mold compound is cured to form solid mold compound. (See mold compound 416, in FIG. 4E). In the method of FIG. 6, a single datum structure, such as 209 in FIG. 2A, or multiple part datum structures, such as 319, 321 in FIGS. 3A-3C, can be used.

Figure 7:
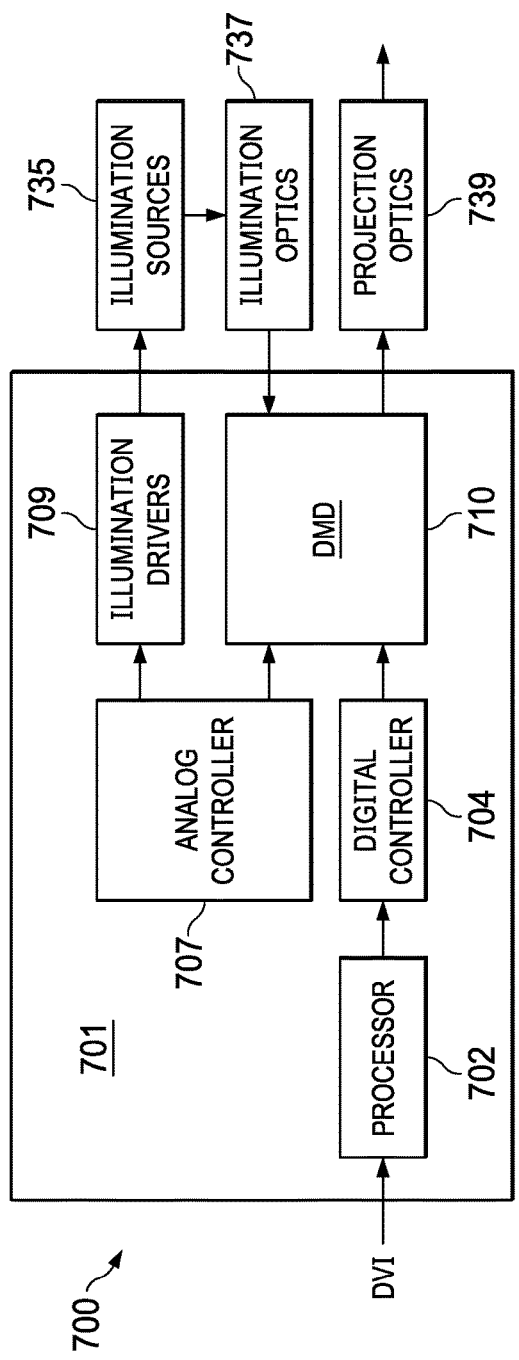
FIG. 7 illustrates, in a block diagram, a system including a semiconductor device of an arrangement.
Figure 8:
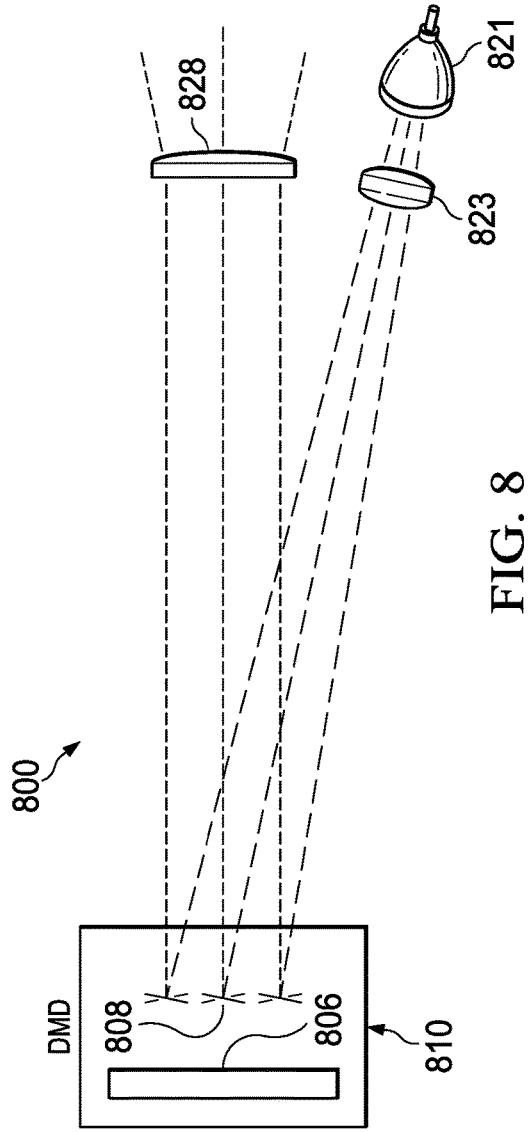
FIG. 8 illustrates in another block diagram a system including a semiconductor device of an arrangement.

FIG. 7 illustrates a system 700 including an example arrangement in a projector. A processor 702, which can be implemented using a digital signal processor (DSP) or a microcontroller unit (MCU), is mounted on a system board 701 and receives digital video input (DVI) signals. A digital controller 704, also mounted to the system board 701, receives data from the processor 702 and provides digital data to the DMD 710, including frame data for display. DMD 710 can be a semiconductor device with a semiconductor die having an active array of digital micromirrors formed over a device side surface, and interposer, and a cover, as described above. DMD 710 can be mounted to the system board 701 using the datum structures of the arrangements, as described above. Analog controller 707 controls power signals to the DMD 710, and to illumination drivers 709, both mounted to the system board 701. The illumination drivers 709 control power to illumination sources 735. Light from the illumination sources 735 is coupled to the DMD 710 by illumination optics 737. Modulated light from the DMD 710 is then coupled to projection optics 739, and the light is then output from system 700. FIG. 8 illustrates in a block diagram an application for a semiconductor device of the arrangements in a projection system 800. Semiconductor device 810 includes a semiconductor die 806, which in this example is a DMD. In this example, the semiconductor die 806 includes digital micromirrors 808 forming picture elements for projecting modulated light. In system 800, a light source 821 and illumination optics 823 direct light from the light source 821 onto the face of the micromirrors 808 within the semiconductor device 710 on a system board. In an example process the micromirrors 808 are formed of aluminum and are mounted on a hinged mechanism. The micromirrors 808 can be tilted using electronic signals applied to electrodes that control a tilt by pivoting the micromirrors about an axis. In an example DMD device, thousands and even millions of the micromirrors are formed in an array. When used in a projection application, individual micromirrors 808 are positioned to reflect the light from the illumination optics 823 to a projection lens 828 and as shown in FIG. 8, a beam of light is projected out of the system 800.

In the arrangements, a semiconductor die is directly mounted to a system board. Conductors couple bond pads on the semiconductor die to bond fingers on the system board. Datum structures are mounted to the system board near the semiconductor die with openings that have sides surrounding the bond fingers on the system board. The openings in the datum structures form three sides of wells and the side of the semiconductor die forms a fourth side of the wells that surround the bond fingers. Mold compound can be deposited in the wells and covers the bond fingers, the conductors, and the bond pads on the semiconductor die. The datum structures include datum features that provide a primary, a secondary, and a tertiary datum for orienting the semiconductor die. In an example arrangement, the semiconductor die is a DMD and is positioned in an optical path. A system can include a system board with the semiconductor die and the datum structures mounted to it, and with additional semiconductor devices mounted to it and coupled to the semiconductor die. In an example application, the semiconductor die is a DMD, and the system is a projector. Use of the arrangements obviates the need for a semiconductor device package for the semiconductor die, reducing costs, and reducing area on the system board. Use of the arrangements can improve the thermal performance of the semiconductor die because a direct thermal dissipation path is formed between the semiconductor die, which is mounted to the system board, and the system board. Use of the arrangements reduces the volume of the system in a vertical direction, reducing the space needed for the system.

Although the example illustrative arrangements have been described in detail, it should be understood that various changes, substitutions and alterations can be made herein without departing from the spirit and scope of the present application as defined by the appended claims. Accordingly, the appended claims are intended to include within their scope processes, machines, manufacture, compositions of matter, means, methods, or steps that provide equivalents to the examples disclosed.

What is claimed is:

1. An apparatus, comprising:
   a board having a surface;
   bond fingers on a surface of the board;
   a semiconductor die on the surface of the board, the semiconductor die comprising a semiconductor device, the semiconductor die having a surface, the semiconductor die comprising bond pads on the surface;
   conductors coupling the bond pads to the bond fingers; and
   a datum structure on the surface of the board, the datum structure having an opening forming a well around the bond fingers, the semiconductor die forming a side of the well.

2. The apparatus of claim 1, the datum structure further comprising:
   features on a surface of the datum structure facing away from the board, the features defining a plane that is at a prescribed angle to a surface plane of an array of micromirrors on the surface of the semiconductor die.

3. The apparatus of claim 1, wherein the datum structure has features that are one of a pin, a slot, or a notch having slanted sides for determining a position of the semiconductor device within a defined plane.

4. The apparatus of claim 1, wherein the datum structure further comprises a pin, a slot, or a notch having an edge, for determining a rotation position for the semiconductor device within a defined plane.

5. The apparatus of claim 1, wherein the semiconductor device further comprises: an array of micromirrors on the surface of the semiconductor die, an interposer over a portion of the surface of the semiconductor die, and a transparent cover over the interposer.

6. The apparatus of claim 1, and further comprising dielectric material deposited in the well and covering the conductors, the bond fingers, and the bond pads.

7. The apparatus of claim 1, wherein the datum structure is a first datum structure, and the apparatus further comprising a second datum structure, the first datum structure and the second datum structure positioned at opposing ends of the semiconductor device.

8. An apparatus, comprising:
a board having a surface;
first bond fingers on the surface of the board;
second bond fingers on the surface of the board;
a first semiconductor die on the surface of the board, the first semiconductor die comprising a first semiconductor device, the first semiconductor die having a first surface, the first semiconductor die having first bond pads on the first surface;
a second semiconductor die on the surface of the board, the second semiconductor die comprising a second semiconductor device, the second semiconductor die having a second surface, the second semiconductor die comprising second bond pads on the second surface;
first conductors coupling the first bond pads to first bond fingers on the surface of the board;
second conductors coupling the second bond pads to the second bond fingers on the surface of the board; and
a datum structure on the board between the first semiconductor die and the second semiconductor die, the datum structure having a first opening forming a first well around the first bond fingers and a second opening forming a second well around the second bond fingers, the first semiconductor die forming a side of the first well and the second semiconductor die forming a side of the second well.

9. The apparatus of claim 8, wherein the datum structure further comprises:
a notch on the datum structure having two slanted sides.

10. The apparatus of claim 8, wherein the datum structure further comprises a notch having an edge.

11. The apparatus of claim 8, wherein the datum structure is a first datum structure, the first semiconductor device having third bond pads on the first surface, the apparatus further comprising:
third bond fingers on the surface of the board;
third conductors coupling the third bond pads on the first surface of the first semiconductor die to the third bond fingers on the surface of the board; and
a second datum structure on the board, the second datum structure having a third opening forming a third well that surrounds the third bond fingers on the board.

12. The apparatus of claim 11, the second semiconductor device having fourth bond pads on the first surface, the apparatus further comprising:
fourth bond fingers on the surface of the board;
fourth conductors coupling the fourth bond pads on the second surface of the second semiconductor die to the fourth bond fingers on the surface of the board; and
a third datum structure on the board, the second datum structure having a fourth opening forming a fourth well that surrounds the fourth bond fingers on the board.

13. The apparatus of claim 12, wherein the second and third datum structures further comprise features on surfaces of the second and third datum structures facing away from the board, the features defining a plane that is parallel to a surface plane of an array of micromirrors on the first semiconductor die.

14. The apparatus of claim 8, and further comprising:
dielectric material in the first well and in the second well of the datum structure over the first and second conductors and the first and second bond fingers, the dielectric material comprising a glob top mold compound or a thermoset epoxy resin mold compound.

15. The apparatus of claim 8, wherein the datum structure comprises a plastic, a polymer, a ceramic, a metal, a film, a tape, or a laminate.

16. A system, comprising:
a board having a surface;
bond fingers on the surface of the board;
a semiconductor die on the board, the semiconductor die comprising a digital micromirror device (DMD) on a surface of the semiconductor die, the semiconductor die having bond pads on the surface;
bond wires coupling the bond pads to the bond fingers; and
a datum structure on the surface of the board, the datum structure having an opening that forms a well around the bond fingers on the board, the semiconductor die forming a side of the well.

17. The system of claim 16, wherein the datum structure further comprises:
features on a surface of the datum structure facing away from the board, the features defining a plane that is parallel to a surface plane of an array of micromirrors on the surface of the semiconductor die.

18. The system of claim 16, wherein the datum structure further comprises a notch on the datum structure having two opposing slanted sides, the slanted sides of the notch arranged to form tangents to an ideal radius so that when the ideal radius positioned with a center point at a predetermined distance from the notch, the ideal radius will touch both the two opposing slanted sides, the center point defining a reference position for the DMD.

19. The system of claim 16, wherein the datum structure further comprises a notch having two edges spaced apart, one edge of the notch defining a rotation of the DMD with respect to a reference point.

20. The system of claim 16, and further comprising dielectric material over the bond wires in the well, the dielectric material comprising a glob top mold compound or a thermoset epoxy resin mold compound.

21. The system of claim 16, wherein the datum structure is a first datum structure and further comprising a second datum structure on the board.

* * * * *